US009287259B2

(12) United States Patent
Shinohara et al.

(10) Patent No.: US 9,287,259 B2
(45) Date of Patent: Mar. 15, 2016

(54) SEMICONDUCTOR INTEGRATED CIRCUIT DEVICE AND METHOD FOR MANUFACTURING SEMICONDUCTOR INTEGRATED CIRCUIT DEVICE

(75) Inventors: Hirofumi Shinohara, Kanagawa (JP);
Yukio Nishida, Kanagawa (JP);
Katsuyuki Horita, Kanagawa (JP);
Tomohiro Yamashita, Kanagawa (JP);
Hidekazu Oda, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/111,549

(22) PCT Filed: Apr. 9, 2012

(86) PCT No.: PCT/JP2012/059642
§ 371 (c)(1),
(2), (4) Date: Oct. 12, 2013

(87) PCT Pub. No.: WO2012/141122
PCT Pub. Date: Oct. 18, 2012

(65) Prior Publication Data
US 2014/0035055 A1 Feb. 6, 2014

(30) Foreign Application Priority Data
Apr. 14, 2011 (JP) ................................. 2011-089693

(51) Int. Cl.
*H01L 27/088* (2006.01)
*H01L 29/66* (2006.01)
*H01L 21/8238* (2006.01)

(52) U.S. Cl.
CPC ...... *H01L 27/088* (2013.01); *H01L 21/823842* (2013.01); *H01L 21/823878* (2013.01); *H01L 29/66477* (2013.01)

(58) Field of Classification Search
CPC ............... H01L 21/823878; H01L 21/823481; H01L 21/76237
USPC .................................................. 257/E21.551
See application file for complete search history.

(56) References Cited

U.S. PATENT DOCUMENTS 6,261,920 B1* 7/2001 Oyamatsu ...................... 438/424
2003/0003644 A1* 1/2003 Uenishi et al. ................ 438/200
(Continued)

FOREIGN PATENT DOCUMENTS

JP 2005-333060 A 12/2005
JP 2008-235351 A 10/2008
(Continued)

OTHER PUBLICATIONS

Narayanan, V., et al., "Band-Edge High-Performance High-κ/Metal Gate n-MOSFETs using Cap Layers containing Group IIA and IIIB Elements with Gate-First Processing for 45 nm and Beyond", 2006 IEEE, 2006 Symposium on VLSI Technology Digest of Technical Papers.
(Continued)

*Primary Examiner* — Ha Tran T Nguyen
*Assistant Examiner* — Jordan Klein
(74) *Attorney, Agent, or Firm* — Shapiro, Gabor and Rosenberger, PLLC

(57) ABSTRACT

MISFETs after the 32 nm technology node have a High-k gate insulating film and a metal gate electrode. Such MISFETs have the problem that the absolute value of the threshold voltage of n-MISFET and p-MISFET inevitably increases by the subsequent high temperature heat treatment. The threshold voltage is therefore controlled by forming various threshold voltage adjusting metal films on a High-k gate insulating film and introducing a film component from them into the High-k gate insulating film. The present inventors have however revealed that lanthanum or the like introduced into the High-k gate insulating film of the n-MISFET is likely to transfer to the STI region by the subsequent heat treatment. The semiconductor integrated circuit device according to the present invention is provided with an N channel threshold voltage adjusting element outward diffusion preventing region in the surface portion of the element isolation region below and at the periphery of the gate stack of the n-MISFET.

2 Claims, 31 Drawing Sheets

(56) References Cited

U.S. PATENT DOCUMENTS

| | | | |
|---|---|---|---|
| 2004/0029353 A1* | 2/2004 | Zheng et al. | 438/424 |
| 2005/0032275 A1* | 2/2005 | Toda et al. | 438/123 |
| 2005/0260825 A1* | 11/2005 | Koester et al. | 438/424 |
| 2006/0267130 A1* | 11/2006 | Rao | 257/499 |
| 2006/0270169 A1* | 11/2006 | Rao | 438/294 |
| 2008/0224234 A1* | 9/2008 | Sasaki | 257/392 |
| 2008/0258134 A1* | 10/2008 | Mears et al. | 257/15 |
| 2008/0315267 A1* | 12/2008 | Hampp et al. | 257/288 |
| 2009/0159981 A1* | 6/2009 | Niimi et al. | 257/369 |
| 2009/0212371 A1* | 8/2009 | Kobayashi | 257/369 |
| 2010/0327365 A1* | 12/2010 | Iwamoto | 257/369 |
| 2011/0198694 A1* | 8/2011 | Ng et al. | 257/347 |
| 2012/0112288 A1* | 5/2012 | Luo et al. | 257/368 |

FOREIGN PATENT DOCUMENTS

| | | |
|---|---|---|
| JP | 2009-194352 A | 8/2009 |
| JP | 2010-205917 A | 9/2010 |
| JP | 2011-009373 A | 1/2011 |
| JP | 2012-038800 A | 2/2012 |

OTHER PUBLICATIONS

Morooka, T., et al., "Suppression of Anomalous Threshold Voltage Increase with Area Scaling for Mg- or La-incorporated High-κ/Metal Gate nMISFETs in Deeply Scaled Region", 2010 IEEE, 2010 Symposium on VLSI Technology Digest of Technical Papers, pp. 33-34.

Office Action issued Aug. 7, 2014, in Japanese Patent Application No. 2013-509894.

* cited by examiner

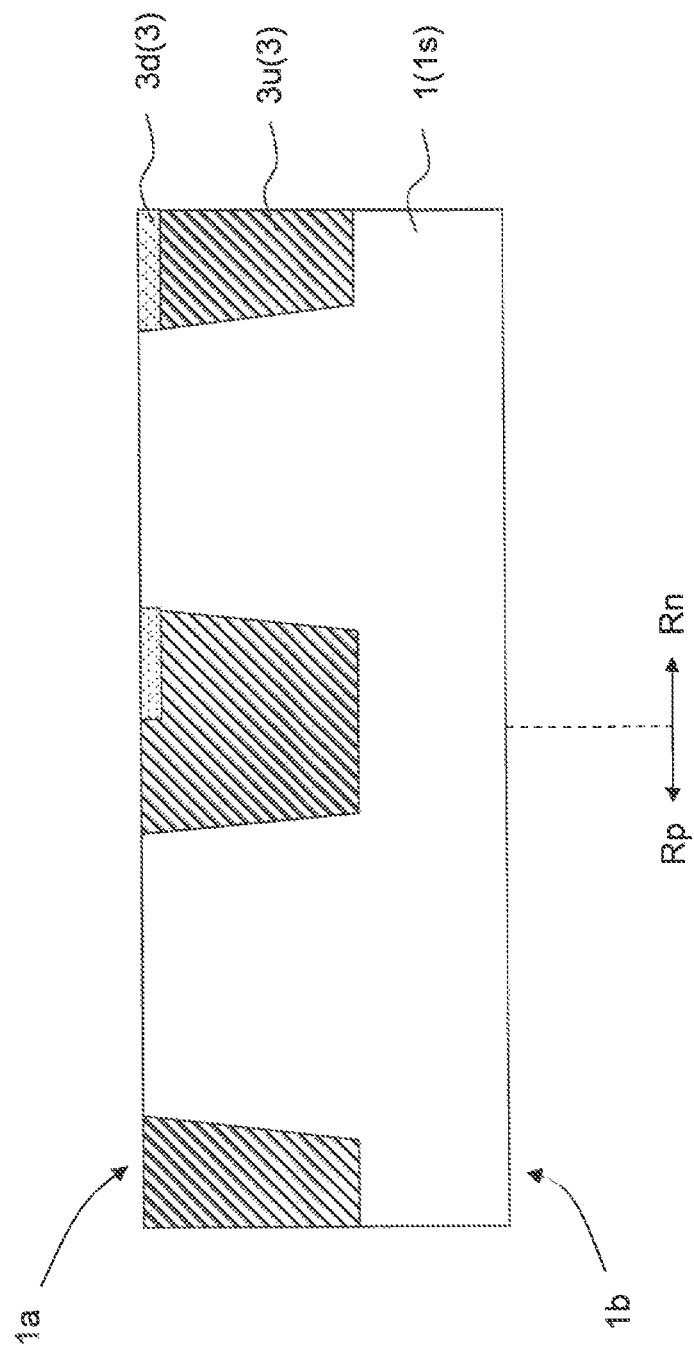

SEMICONDUCTOR INTEGRATED CIRCUIT DEVICE AND METHOD FOR MANUFACTURING SEMICONDUCTOR INTEGRATED CIRCUIT DEVICE

TECHNICAL FIELD

The present invention relates to a technology effective when applied to a threshold voltage control technology in a semiconductor integrated circuit device and a method for manufacturing a semiconductor integrated circuit device (or semiconductor device).

BACKGROUND ART

V. Narayanan and 25 others, "Band-Edge High-Performance high-k/Metal Gate n-MOSFETs using Cap Layers Containing Group IIA and IIIB Elemens with Gate-First Processing for 45 nm and Beyond", 2006 Symposium on VLSI Technology Digest of Technical Papers (Non-patent Document 1) discloses a technology for simultaneously reducing, with good balance, the threshold voltages (more precisely, the absolute value thereof) of both an n-MISFET (Metal Insulator Semiconductor Field Effect Transistor) and a p-MISFET, each having a High-k gate insulating film. In this technology, on the High-k gate insulating films of the respective regions, another metal or metal oxide is formed and the component thereof is introduced into the High-k gate insulating films.

T. Morooka and 13 others, "Suppression of Anomalous Threshold Voltage Increase with Area Scaling for Mg- or La-incorporated High-k/Metal Gate nMOSFETs in Deep Scaled Region", 2010 Symposium on VLSI Technology Digest of Technical Papers (Non-patent Document 2) discloses a technology for controlling the threshold voltages of an n-MISFET and p-MISFET. In this technology, the processed end portion of a High-k gate insulating film is extended to the end portion of an offset sidewall in order to prevent the concentration of an additive component, which has been introduced into the High-k gate insulating film, from decreasing due to the diffusion caused later by high-temperature heat treatment.

PRIOR ART DOCUMENTS

Non-Patent Documents

[NON-PATENT DOCUMENT 1] V. Harayanan and 25 others, "Band-Edge High-Performance high-k/Metal Gate n-MOSFETs using Cap Layers Containing Group IIA and IIIB Elemens with Gate-First Processing for 45 nm and Beyond", 2006 Symposium on VLSI Technology Digest of Technical Papers

[NON-PATENT DOCUMENT 1] T. Morooka and 13 others, "Suppression of Anomalous Threshold Voltage Increase with Area Scaling for Mg- or La-incorporated High-k/Metal Gate nMOSFETs in Deep Scaled Region", 2010 Symposium on VLSI Technology Digest of Technical Papers

DISCLOSURE OF THE INVENTION

Problems that the Invention is to Solve

In MISFETs used in SOC (System on Chip) and the like after the 32 nm technology node, both a High-k gate insulating film and a metal gate electrode have been introduced. They have the problem that the absolute value of the threshold voltage of the n-MISFET and p-MISFET inevitably increases due to high-temperature heat treatment conducted later. The threshold voltage has therefore been controlled by forming a threshold voltage adjusting metal film or a threshold voltage adjusting metal oxide film on the High-k gate insulating film and then introducing the component of these films in the High-k gate insulating film. It has however been revealed by the present inventors that such threshold voltage control has the problem that lanthanum or the like introduced into the High-k gate insulating film of the n-MISFET easily transfers to an STI (Shallow Trench Isolation) region or the like by the heat treatment conducted later.

The present invention has been made with a view to overcoming the above-mentioned problems.

An object of the present invention is to provide a highly reliable semiconductor integrated circuit device or process for manufacturing a semiconductor integrated circuit device.

The above-mentioned and other objects and novel features of the present invention will be apparent by the description herein and accompanying drawings.

Means for Solving the Problems

The outline of a typical invention, among the inventions disclosed herein, will next be described briefly.

One of the present inventions is a semiconductor integrated circuit device having an N channel threshold voltage adjusting element outward diffusion prevention region in the surface portion of an element isolation region below and around the gate stack of an n-MISFET.

Effect of the Invention

An effect available by the typical invention disclosed herein will hereinafter be described briefly.

In the semiconductor integrated circuit device, an N channel threshold voltage adjusting element outward diffusion prevention region is provided in the surface portion of the element isolation region below and around the gate stack of the n-MISFET is provided. This makes it possible to prevent transfer of lanthanum or the like introduced into a High-k gate insulating film of the n-MISFET to the STI region (element isolation region) or the like which will otherwise occur by the heat treatment conducted later.

BRIEF DESCRIPTION OF THE DRAWINGS

FIG. 31 is a device cross-sectional view (a step of removing the STI forming silicon nitride film and the like) corresponding to the X-X' cross-section of FIG. 27 for describing the main part process in the manufacturing method (the nitrogen ion implantation system) corresponding to the modification example (the nitrogen doped STI structure) of the device structure of the semiconductor integrated circuit device according to the one embodiment of the present application.

BEST MODE FOR CARRYING OUT THE INVENTION

Summary of the Embodiments

Figure 1:
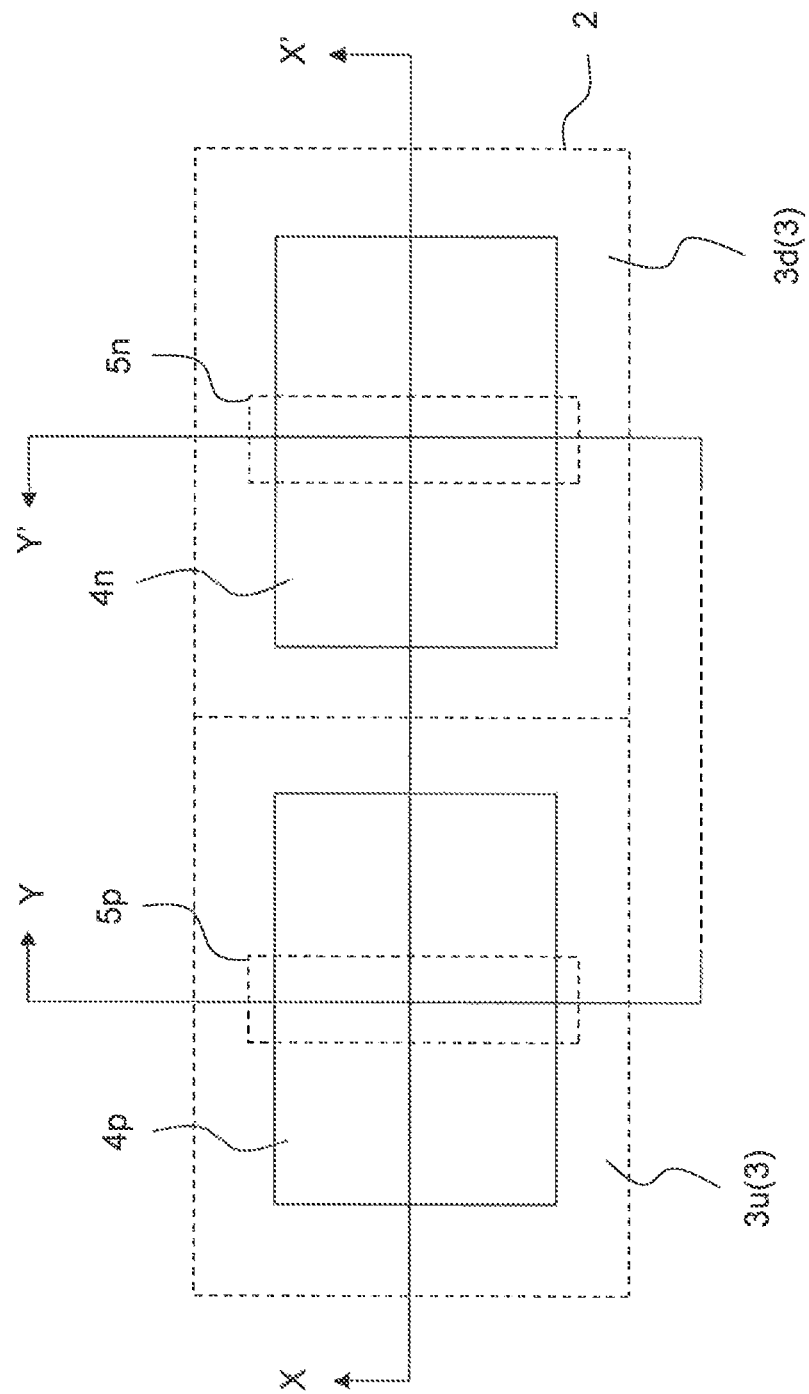
FIG. 1 is a device fragmentary top view for describing the device structure (an N channel threshold voltage adjusting element-doped STI structure) of a semiconductor integrated circuit device according to one embodiment of the present application.

First, typical embodiments of the invention disclosed herein will be summarized.

1. A semiconductor integrated circuit device, including:
(a) an element isolation region disposed in the surface of a first main surface of a semiconductor substrate;
(b) an N channel active region and a P channel active region disposed in the surface of the first main surface of the semiconductor substrate and separated from each other by the element isolation region;
(c) an N channel gate stack disposed over the first main surface of the semiconductor substrate, traversing the N channel active region, and constituting an N channel MISFET;
(d) a P channel gate stack disposed over the first main surface of the semiconductor substrate, traversing the P channel active region, and constituting a P channel MISFET; and
(e) an N channel threshold voltage adjusting element outward diffusion preventing region disposed in the surface region of the element isolation region below and at the periphery of the N channel gate stack.

2. The semiconductor integrated circuit device as described above in 1, wherein the N channel threshold voltage adjusting element outward diffusion preventing region has been doped with an N channel threshold voltage adjusting element.

3. The semiconductor integrated circuit device as described above in 2, wherein the N channel threshold voltage adjusting element is any of La, Y, Mg, or Sc.

4. The semiconductor integrated circuit device as described above in any of 1 to 3, wherein the N channel threshold voltage adjusting element outward diffusion prevention region has been doped with nitrogen.

5. The semiconductor integrated circuit device as described above in any one of 1 to 4, wherein the N channel threshold voltage adjusting element outward diffusion preventing region is not disposed in the surface region of the element isolation region below and at the periphery of the P channel gate stack.

6. A method for manufacturing a semiconductor integrated circuit device, including the following steps of:
(a) forming an element isolation region in the surface of a first main surface of a semiconductor wafer to define an N channel active region and a P channel active region in the surface of the first main surface of the semiconductor substrate;
(b) forming, over the first main surface of the semiconductor substrate, an N channel gate stack (including a true gate stack and a dummy gate stack) that traverses the N channel active region and constitutes an N channel MISFET;
(c) forming, over the first main surface of the semiconductor substrate, a P channel gate stack that traverses the P channel active region and constitutes a P channel MISFET; and
(d) prior to the steps (b) and (c) but after the step (a), forming an N channel threshold voltage adjusting element outward diffusion preventing region in the surface region of the element isolation region below and at the periphery of the N channel gate stack.

The method for manufacturing a semiconductor integrated circuit device as described above in 6, wherein the N channel threshold voltage adjusting element outward diffusion preventing region is formed by implanting N channel threshold voltage adjusting element ions.

8. The method for manufacturing a semiconductor integrated circuit device as described above in 6 or 7, wherein the N channel threshold voltage adjusting element outward diffusion preventing region is formed by implanting nitrogen ions.

9. The method for manufacturing a semiconductor integrated circuit device as described above in 6, wherein the N channel threshold voltage adjusting element outward diffusion preventing region is formed by depositing an N channel threshold voltage adjusting element or oxide thereof over a portion of the surface of the element isolation region which is to be the N channel threshold voltage adjusting element outward diffusion preventing region and then heat treating the resulting film.

10. The method for manufacturing a semiconductor integrated circuit device as described above in any one of 6 to 9, wherein the N channel threshold voltage adjusting element outward diffusion preventing region is formed without forming the N channel threshold voltage adjusting element outward diffusion preventing region in the surface region of the element isolation region below and at the periphery of the P channel gate stack.

11. The method for manufacturing a semiconductor integrated circuit device as described above in any of 6, 9, or 10, wherein the N channel threshold voltage adjusting element is any of La, Y, Mg, or Sc.

[Explanation of Description Manner, Basic Terms, and Usage in the Present Application]

1. In the present application, a description in embodiments may be made after divided in a plurality of sections if necessary for convenience's sake. These sections are not independent from each other, but they may each be a part of a single example or one of them may be a partial detail of the other or a modification example of a part or whole of the other one unless otherwise specifically indicated. In principle, a description on a portion similar to that described before is not repeated. Moreover, constituent elements in the embodiments are not essential unless otherwise specifically indicated, limited to the number theoretically, or principally apparent from the context that they are essential.

Further, the term "semiconductor device" or "semiconductor integrated circuit device" as used herein means mainly a simple device of various transistors (active elements) or a device obtained by integrating such a simple device as a main component with a resistor, a capacitor, and the like on a semiconductor chip or the like (for example, a single crystal silicon substrate). Typical examples of the various transistors include MISFET (Metal Insulator Semiconductor Field Effect Transistor) typified by MOSFET (Metal Oxide Semiconductor Field Effect Transistor). Typical examples of an integrated circuit constitution include CMIS (Complemetary Metal Insulator Semiconductor) integrated circuits typified by CMOS (Complemetary Metal Oxide Semiconductor) integrated circuits having an N channel MISFET and a P channel MISFET in combination.

A wafer step of semiconductor integrated circuit devices today, that is, LSI (Large Scale Integration), can usually be classified roughly into FEOL (Front End of Line) steps and BEOL (Back End of Line) steps. The FEOL steps involve steps from delivery of a silicon wafer as a raw material to a premetal (Premetal) step (a step including formation of an interlayer insulating film, formation of a contact hole, filling of a tungsten plug, and the like between the lower end of a M1 wiring layer and a gate electrode structure) or the like step. The BEOL step involves steps from formation of the M1 wiring layer to formation of a pad opening in a final passivation film on an aluminum-based pad electrode (in a wafer level package process, this process is also included). Of the FEOL steps, steps such as gate electrode patterning and contact hole formation are microfabrication steps which require particularly fine processing. On the other hand, in the BEOL steps, a via and trench formation step, especially, the formation of local wirings at a relatively lower layer (for example, fine buried wiring layers from M1 to M3 in a buried wiring structure with about four layers and fine buried wiring layers from M1 to M5 in a buried wiring structure with about ten layers) requires microfabrication. It is to be noted that "MN (normally, N=ranging from 1 to 15)" represents an N-th level wiring layer counted from the lower side. The M1 represents a first-level wiring layer, and the M3 represents a third-level wiring layer.

2. Similarly in the description of the embodiments, with regard to any material, any composition or the like, the term "X made of A" or the like does not exclude X having, as one of the main constituent components thereof, an element other than A unless otherwise specifically indicated or principally apparent from the context that it is not. For example, with regard to a component A, the term "X made of A" means that "X has A as a main component thereof". It is needless to say that, for example, the term "silicon member" is not limited to a member made of pure silicon but also means a member made of a SiGe alloy or another multi-element alloy having silicon as a main component or a member containing another additive. Similarly, the term "silicon oxide film", "silicon oxide-based insulating film", or the like is not limited to a relatively pure undoped silicon oxide (Undoped Silicon Dioxide) but needless to say, it embraces an FSG (Fluorosilicate Glass) film, a TEOS-based silicon oxide (TEOS-based silicon oxide) film, an SiOC (Silicon Oxycarbide) film or carbon-doped silicon oxide (Carbon-doped Silicon oxide) film, a thermal oxidation film such as OSG (Organosilicate glass) film, PSG (Phosphorus Silicate Glass) film, or BPSG (Borophosphosilicate Glass) film, a CVD oxide film, silicon oxide films obtained by the method of application such as SOG (Spin on Glass) film and nano-clustering silica (Nano-Clustering Silica: NCS) film, silica-based low-k insulating films (porous insulating films) obtained by introducing pores into members similar to them, and composite films each made of any one of the above-mentioned films as a principal constituent and another silicon-based insulating film.

Silicon-based insulating films ordinarily used in the semiconductor field like silicon oxide-based insulating films also include silicon nitride-based insulating films. Materials that belong to such a group include SiN, SiCN, SiNH, and SiCNH. The term "silicon nitride" embraces both SiN and SiNH unless otherwise specifically indicated that it is not. Similarly, the term "SiCN" embraces both SiCN and SiCNH unless otherwise specifically indicated that it is not.

Incidentally, SiC has similar properties to SiN, but in most cases, SiON should be classified rather as a silicon oxide-based insulating film.

Silicon nitride films are frequently used not only as an etch stop film or a CESL (Contact Etch Stop Layer) in the SAC (Self-Aligned Contact) technology but also as a stress imparting film (stressor or stressor film) in SMT (Stress Memorization Technique).

Similarly, the term "nickel silicide" ordinarily means nickel monosilicide. It includes not only a relatively pure one but also an alloy, mixed crystal, and the like having nickel monosilicide as a main constituent. The term "silicide" is not limited to "nickel silicide" but may mean a conventionally established silicide such as cobalt silicide, titanium silicide, or tungsten silicide. As a metal film for silicidation, usable are, in addition to Ni (nickel) films, nickel alloy films such as Ni—Pt alloy films (alloy films between Ni and Pt), Ni—V alloy films (alloy films between Ni and V), Ni—Pd alloy films (alloy films between Ni and Pd), Ni—Yb alloy films (alloy films between Ni and Yb), and Ni—Er alloy films (alloy films between Ni and Er). These silicides containing nickel as a principal metal element are generically referred to as "nickel-based silicide(s)".

3. Preferred examples of the shape, position, attribute, and the like will be shown below, however, it is needless to say that the shape, position, attribute, and the like are not strictly limited to these preferred examples unless otherwise specifically indicated or apparent from the context that they are not.

4. When a reference is made to a specific number or amount, the number or amount may be greater than or less than the specific number or amount unless otherwise specifically indicated, limited to the specific number or amount theoretically, or apparent from the context that it is not.

5. The term "wafer" usually means a single crystal silicon wafer over which a semiconductor integrated circuit device (which may be a semiconductor integrated circuit device or an electronic device) is to be formed. It is however needless to say that it embraces a composite wafer of an insulating substrate and a semiconductor layer or the like, such as an epitaxial wafer, a SOI substrate, or an LCD glass substrate 6. The term "gate" as used herein means an "actual gate", that is, a gate which will actually serve as a gate and also a so-called "dummy gate" or "replacement gate" which will be removed later. The term "gate stack" means a stack mainly comprised of a gate insulating film and a gate electrode (which will be called "actual gate stack" when it should be distinguished from "a dummy gate stack"). The term "High-k gate stack" means a gate insulating film having therein a High-k gate insulating layer.

The term "gate side surface structure" means a gate peripheral structure such as offset spacer or sidewall spacer formed on the sidewalls of the gate stack. Moreover, a gate peripheral structure including agate stack and a gate side surface structure is called "gate structure".

The term "gate first system" as used herein means a system of conducting formation of an actual gate stack prior to the activation heat treatment of source and drain in a manufacturing method of an integrated circuit device in which MISFETs have been integrated. On the other hand, the term "gate last system" means a system of conducting formation of main constituents of an actual gate stack after activation heat treatment of source and drain. Of the gate last system, a system of conducting formation of an interfacial gate insulating film (interfacial actual gate insulating film) and a High-k gate insulating film (actual gate insulating film) prior to the activation heat treatment of source and drain and conducting formation of main constituents of the actual gate stack lying thereover after the activation heat treatment of source and drain is called "High-k first-metal gate last system".

In the High-k first-metal gate last system, the interfacial gate insulating film (so-called IL) or the High-k gate insulating film are constituents of a dummy gate stack but they are also constituents of an actual gate stack so that they may be called, depending on the name at the time point in the description on the process.

7. The term "active region" as used herein means a region encompassed by element isolation regions on the device surface of a semiconductor substrate and means a portion which is to be a channel region or a source-drain region of an MISFET or the like.

Moreover, the term "N channel threshold voltage adjusting element outward diffusion preventing region" means a region for preventing outward diffusion, from the gate insulating film to the element isolation region (for example, STI region), of an N channel threshold voltage adjusting element such as La, Y, Mg, or Sc to be added for adjusting the threshold voltage of an N channel MISFET having a High-k gate insulating film. More specifically, it is an N channel threshold voltage adjusting element introduction region, nitrogen introduction region, or the like.

Further Detailed Description of the Embodiments

Embodiments will next be described further. In all the drawings, the same or like members will be identified by the same or like symbols or reference numerals and overlapping descriptions will be omitted in principle.

In the accompanying drawings, hatching or the like is sometimes omitted even from the cross-section when it makes the drawing cumbersome and complicated or when a member can be discriminated clearly from a vacant space. In relation thereto, even if a hole is two-dimensionally closed, a background outline thereof may be sometimes omitted when it is obvious from the description or the like that the hole is two-dimensionally closed and so on. Moreover, even a portion other than a cross section may be hatched to clearly show that the hatched portion is not a vacant space.

1. Description on the device structure (N channel threshold voltage adjusting element-doped STI structure) of the semiconductor integrated circuit device according to one embodiment of the present application (mainly, from FIG. 1 to FIG. 3)

A specific description will be made with a CMIS semiconductor integrated circuit device of the 32 nm technology node as an example, but it is needless to say that the device structure can also be applied to products having a size smaller or greater than the above-mentioned one.

A description will next be made mainly on a gate first system for the sake of description, but the device structure can also be applied to a gate last system including an intermediate mode such as High-k first metal gate last system and the like.

Figure 2:
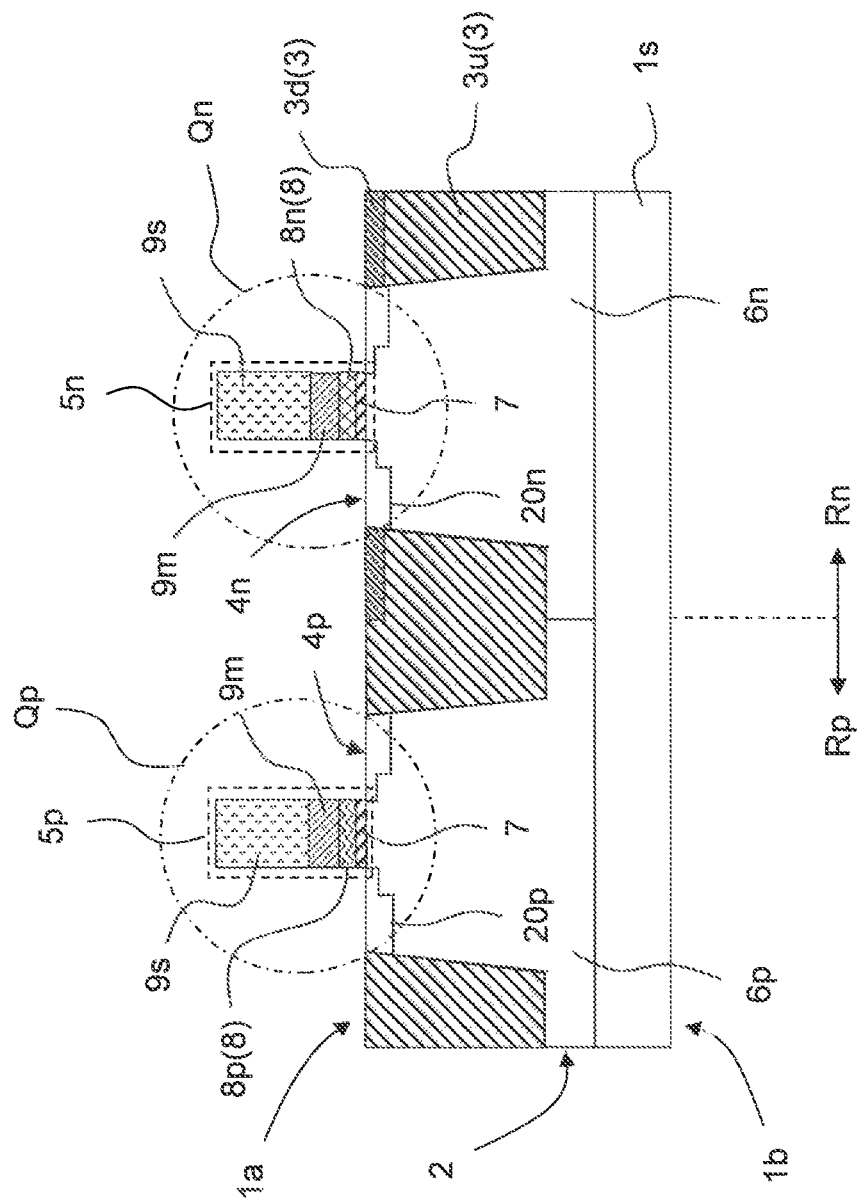
FIG. 2 is a device cross-sectional view corresponding to the X-X' cross-section of FIG. 1.
Figure 3:
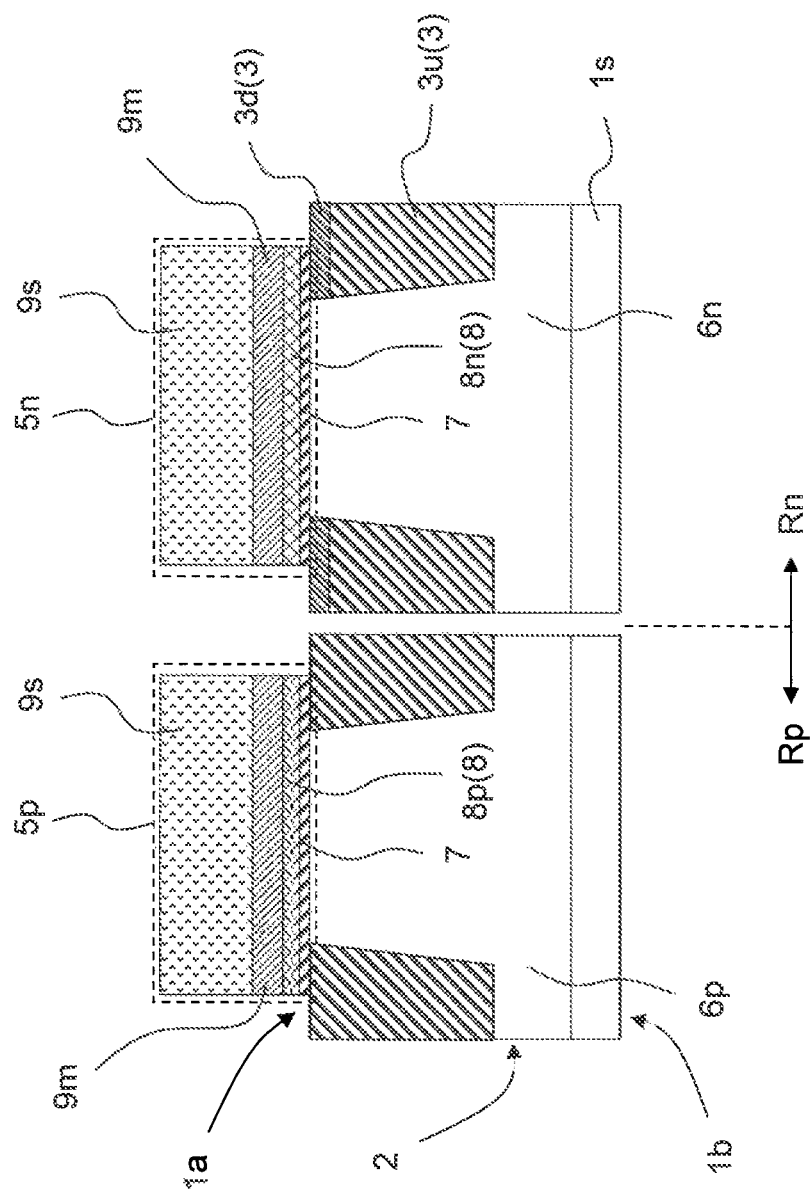
FIG. 3 is a device cross-sectional view corresponding to the Y-Y' cross-section of FIG. 1.

FIG. 1 is a device fragmentary top view for describing the device structure (an N channel threshold voltage adjusting element-doped STI structure) of a semiconductor integrated circuit device according to one embodiment of the present application. FIG. 2 is a device cross-sectional view corresponding to the X-X' cross-section of FIG. 1, FIG. 3 is a device cross-sectional view corresponding to the Y-Y' cross-section of FIG. 1. Based on these drawings, the device structure (N channel threshold voltage adjusting element-doped STI structure) and the like of the semiconductor integrated circuit device according to the one embodiment of the present application will be described.

As shown in FIG. 1, on a device surface 1a of a semiconductor chip 2, respective active regions of an N channel MISFET (Qn) and a P channel MISFET (Qp) configuring CMIS, that is, an N channel active region 4n and a P channel active region 4p are each surrounded by an STI (Shallow Trench Isolation) region 3 (element isolation region). The surface region of this element isolation region 3 is divided into an N channel threshold voltage adjusting element-introduced region 3d (N channel threshold voltage adjusting element outward diffusion preventing region) at the periphery of the N channel active region 4n and an N channel threshold voltage adjusting element non-introduced region 3u at the periphery of the P channel active region 4p. An N channel gate stack 5n and a P channel gate stack 5p longitudinally traverse or traverse the center portion of the N channel active region 4n and the P channel active region 4p, respectively.

Next, as shown in FIG. 2, the semiconductor chip 2 has two portions, that is, a substrate portion is (P type single crystal silicon substrate portion) and a well portion thereon. The well portion is divided into an N well region 6n corresponding to an N channel device region Rn and a P well region 6p corresponding to a P channel device region Rp. The N channel gate stack 5n and the P channel gate stack 5p have, in the surface region thereof, an N type source drain region 20n and a P type source drain region 20p, respectively. The N channel gate stack 5n is comprised of, in order from the lower side, an IL (Interfacial Layer), that is, interfacial silicon oxide-based insulating film 7, an N channel High-k gate insulating film 8n (High-k gate insulating film 8), a metal gate electrode film 9m, a polysilicon gate electrode film 9s, and the like. On the other hand, the P channel gate stack 5p is comprised of, in order from the lower side, an IL, that is, an interfacial silicon oxide-based insulating film 7, a P channel High-k gate insulating film 8p (High-k gate insulating film 8), a metal gate electrode film 9m, a polysilicon gate electrode film 9s, and the like.

Next, as shown in FIG. 3, the N channel gate stack 5n has, in the surface of the STI region 3 (element isolation region) below or at the periphery of the gate stack, an N channel threshold voltage adjusting element-introduced region 3d. On the other hand, the P channel gate stack 5p does not have, in the surface of the STI region 3 (element isolation region) below or at the periphery of the gate stack, the N channel threshold voltage adjusting element-introduced region 3d, because it adversely affects the threshold voltage control of the P channel MISFET (Qp).

As shown in FIG. 1, the N channel threshold voltage adjusting element-introduced region 3d extends across almost the whole surface region of the STI region 3 (element isolation region) corresponding to the N channel device region Rn because of manufacturing ease, but it may extend over only the surface region of the STI region 3 (element isolation region) below or at the periphery of the N channel gate stack 5n.

It is essentially preferred in consideration of the process that the N channel threshold voltage adjusting element-introduced region 3d (N channel threshold voltage adjusting element outward diffusion preventing region) is obtained by doping with the same N channel threshold voltage adjusting element as the N channel threshold voltage adjusting element with which the N channel High-k gate insulating film 8n has been doped. The region may be formed by doping with a different N channel threshold voltage adjusting element. Preferred examples of the N channel threshold voltage adjusting element include La, Y, and Sc (which are rare earth elements), and Mg (element in Group II of the periodic table).

2. Description on the main part process in the process (N channel threshold voltage adjusting element ion implantation system) for manufacturing the semiconductor integrated circuit device according to the one embodiment of the present application (mainly, from FIG. 4 to FIG. 15)

In this section, the main part process for actualizing the device structure described in Section 1 will be described. In the following description, the main part process until patterning of a gate stack will be mainly described, because there are various selections including selection of a gate first system or a gate last system, as needed, for the formation of a gate structure including the gate side-surface structure after patterning of a gate stack, introduction of a source drain region, and the like, depending on the process system employed.

Figure 4:
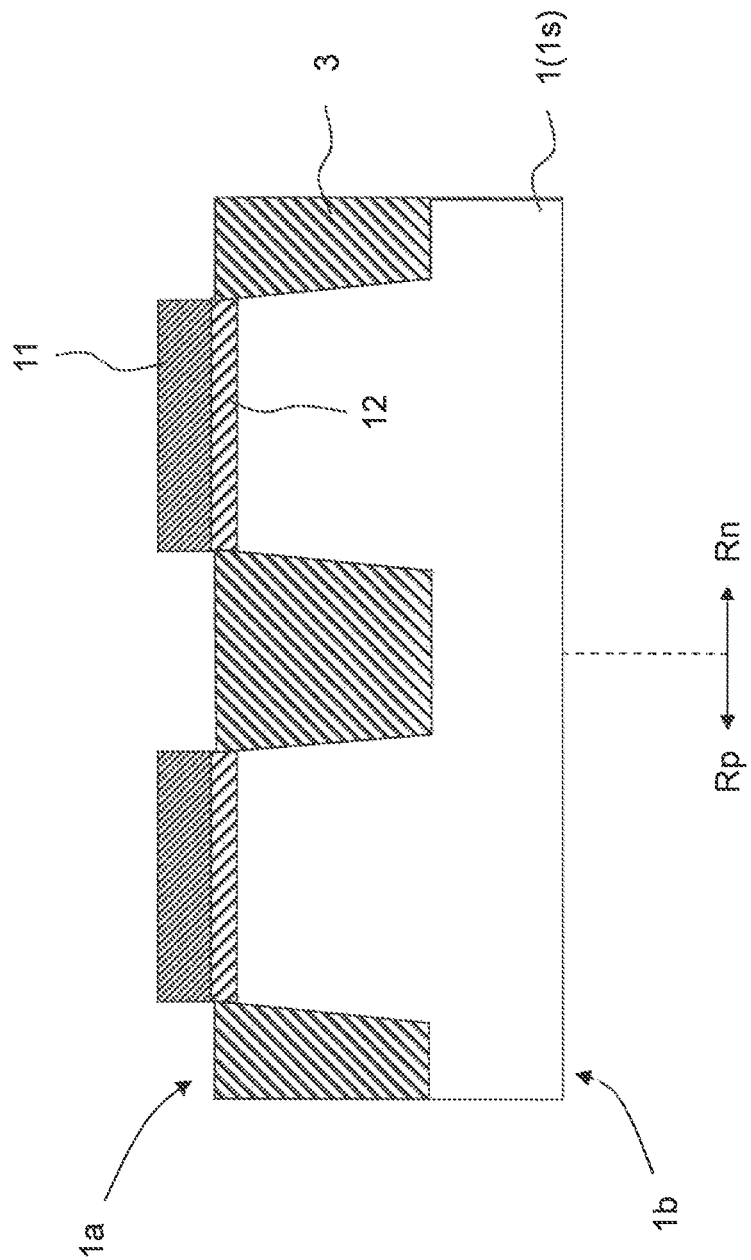
FIG. 4 is a device cross-sectional view (during formation of an STI region) corresponding to the X-X' cross-section of FIG. 1 for describing the main part process in a method (an N channel threshold voltage adjusting element ion implantation system) for manufacturing the semiconductor integrated circuit device according to the one embodiment of the present application.
Figure 5:
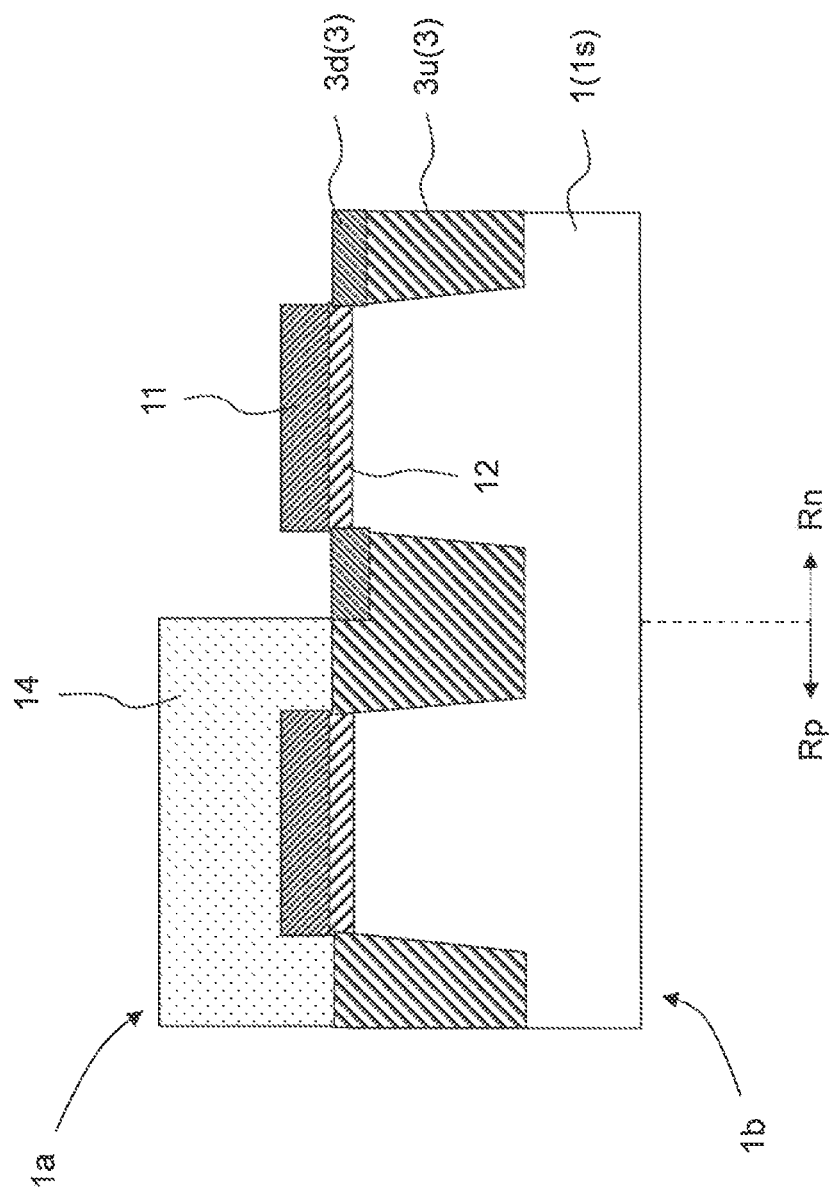
FIG. 5 is a device cross-sectional view (a step of implanting an N channel threshold voltage adjusting element ion) corresponding to the X-X' cross-section of FIG. 1 for describing the main part process in the method (the N channel threshold voltage adjusting element ion implantation system) for manufacturing the semiconductor integrated circuit device according to the one embodiment of the present application.
Figure 6:
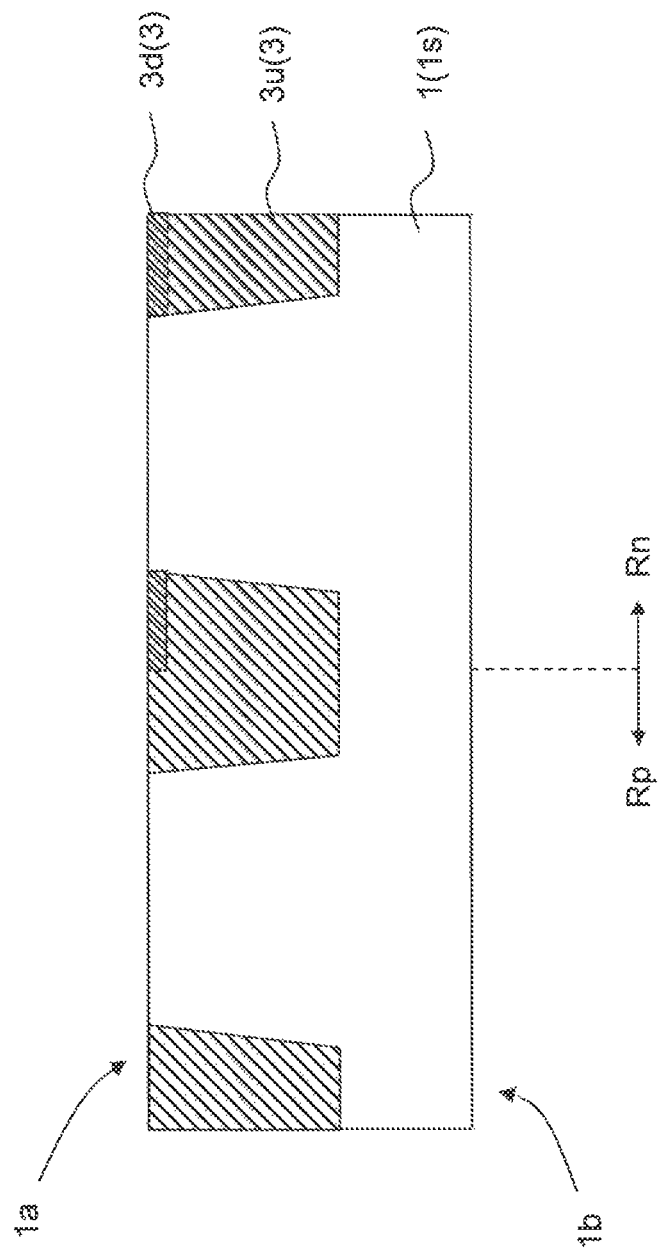
FIG. 6 is a device cross-sectional view (a step of removing an STI forming silicon nitride film and the like) corresponding to the X-X' cross-section of FIG. 1 for describing the main part process in the method (the N channel threshold voltage adjusting element ion implantation system) for manufacturing the semiconductor integrated circuit device according to the one embodiment of the present application.
Figure 7:
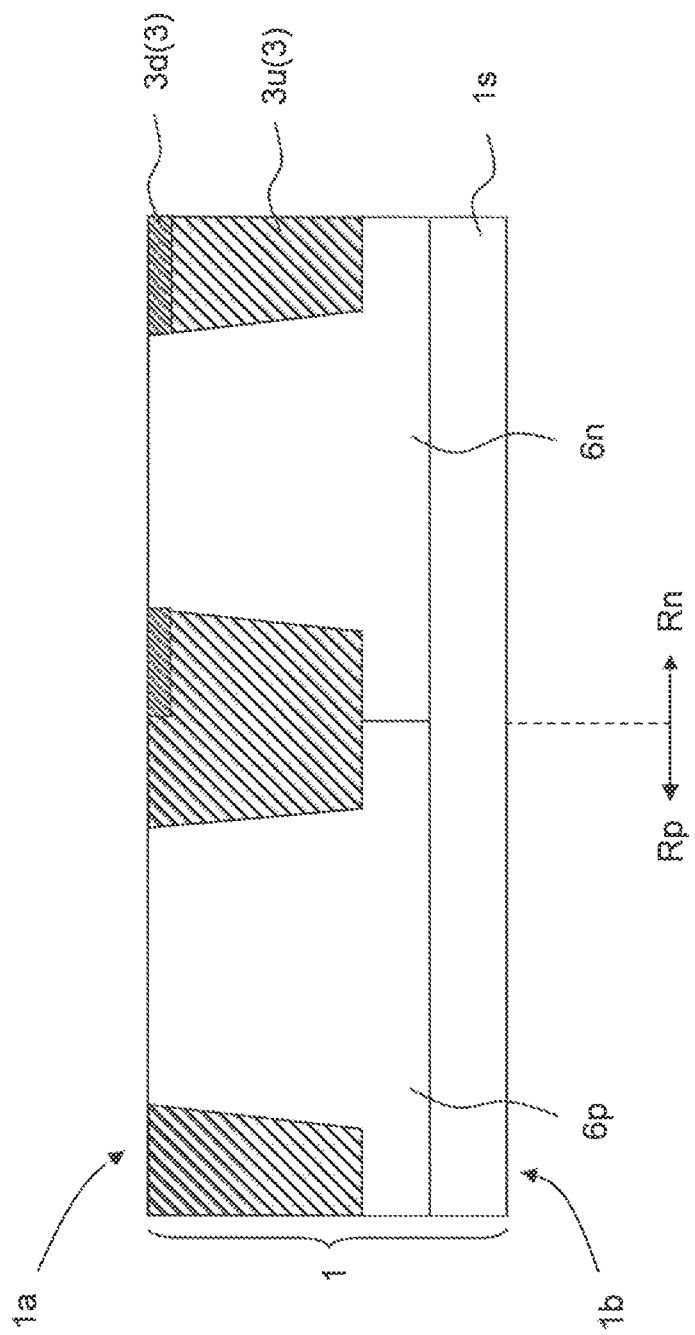
FIG. 7 is a device cross-sectional view (a step of forming a well region) corresponding to the X-X' cross-section of FIG. 1 for describing the main part process in the method (the N channel threshold voltage adjusting element ion implantation system) for manufacturing the semiconductor integrated circuit device according to the one embodiment of the present application.
Figure 8:
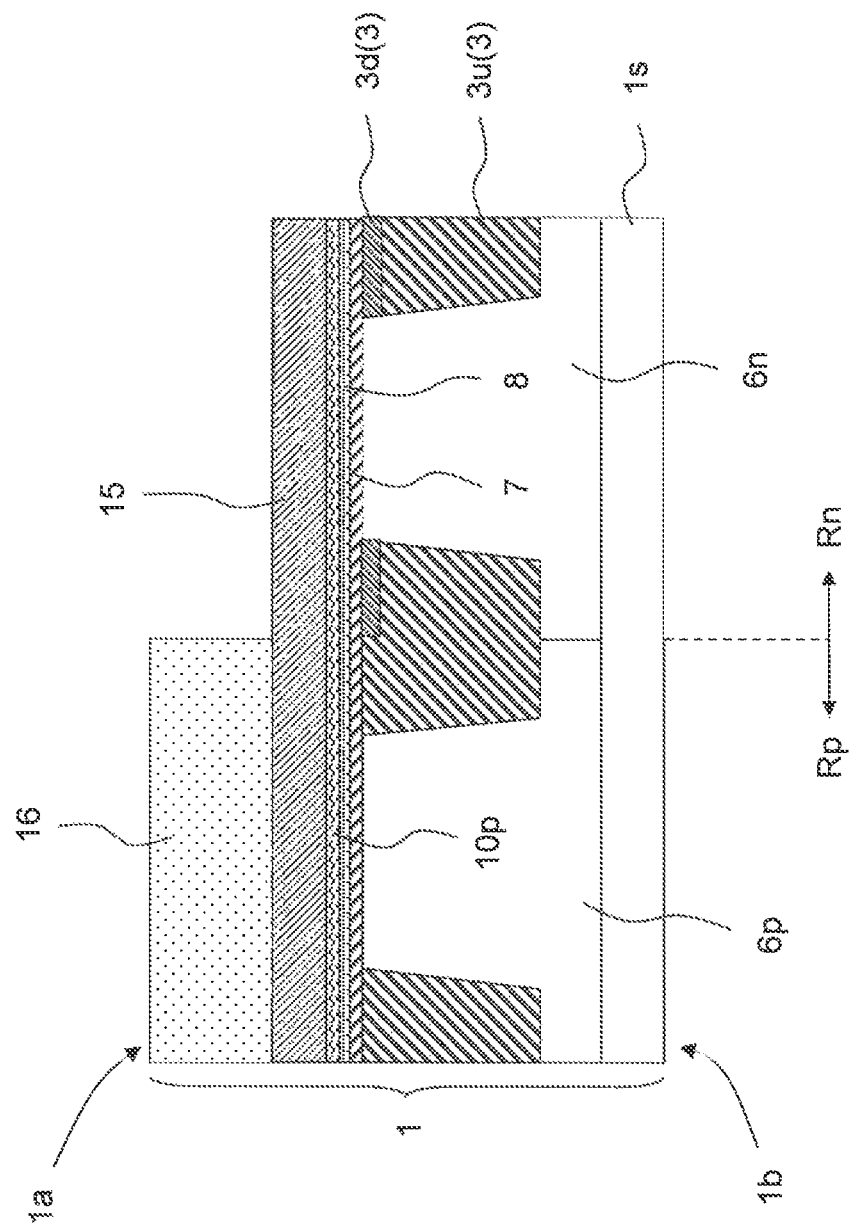
FIG. 8 is a device cross-sectional view (a step of forming a resist film for a hardmask for processing a P channel threshold voltage adjusting film) corresponding to the X-X' cross-section of FIG. 1 for describing the main part process in the method (the N channel threshold voltage adjusting element ion implantation system) for manufacturing the semiconductor integrated circuit device according to the one embodiment of the present application.
Figure 9:
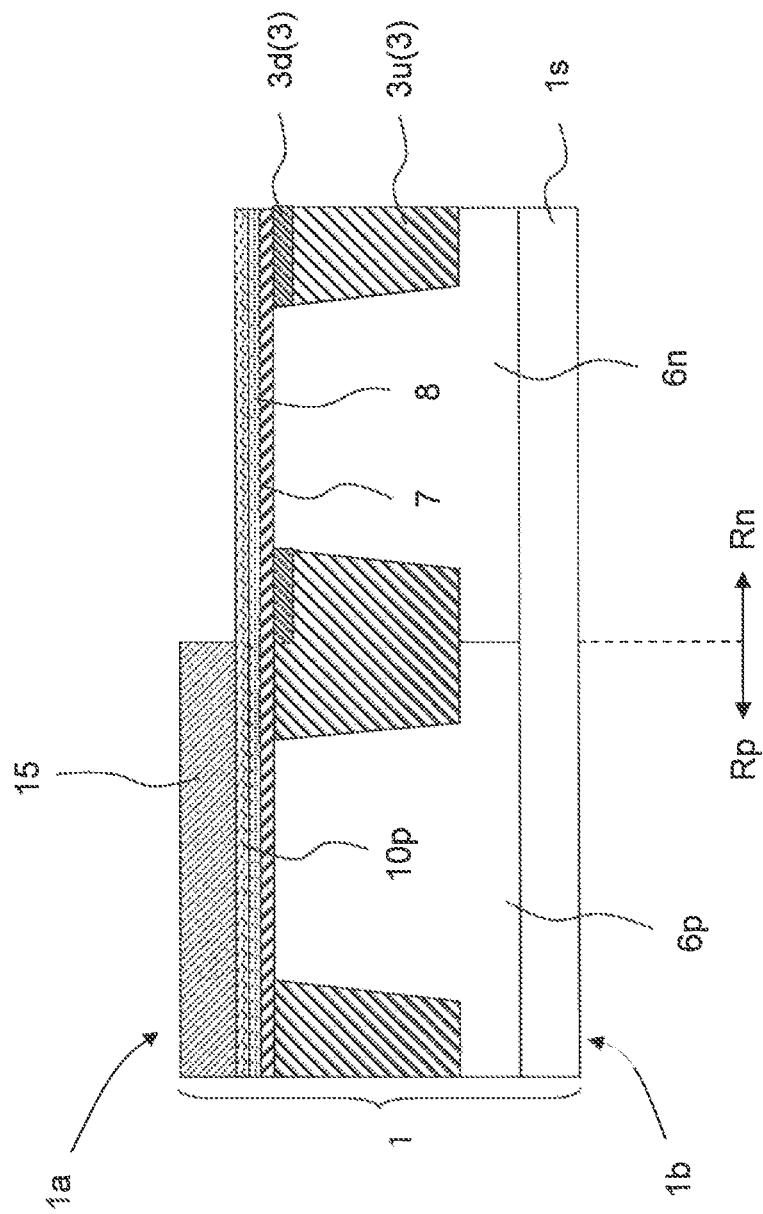
FIG. 9 is a device cross-sectional view (a step of processing the hardmask film for processing a P channel threshold voltage adjusting film) corresponding to the X-X' cross-section of FIG. 1 for describing the main part process in the method (the N channel threshold voltage adjusting element ion implantation system) for manufacturing the semiconductor integrated circuit device according to the one embodiment of the present application.
Figure 10:
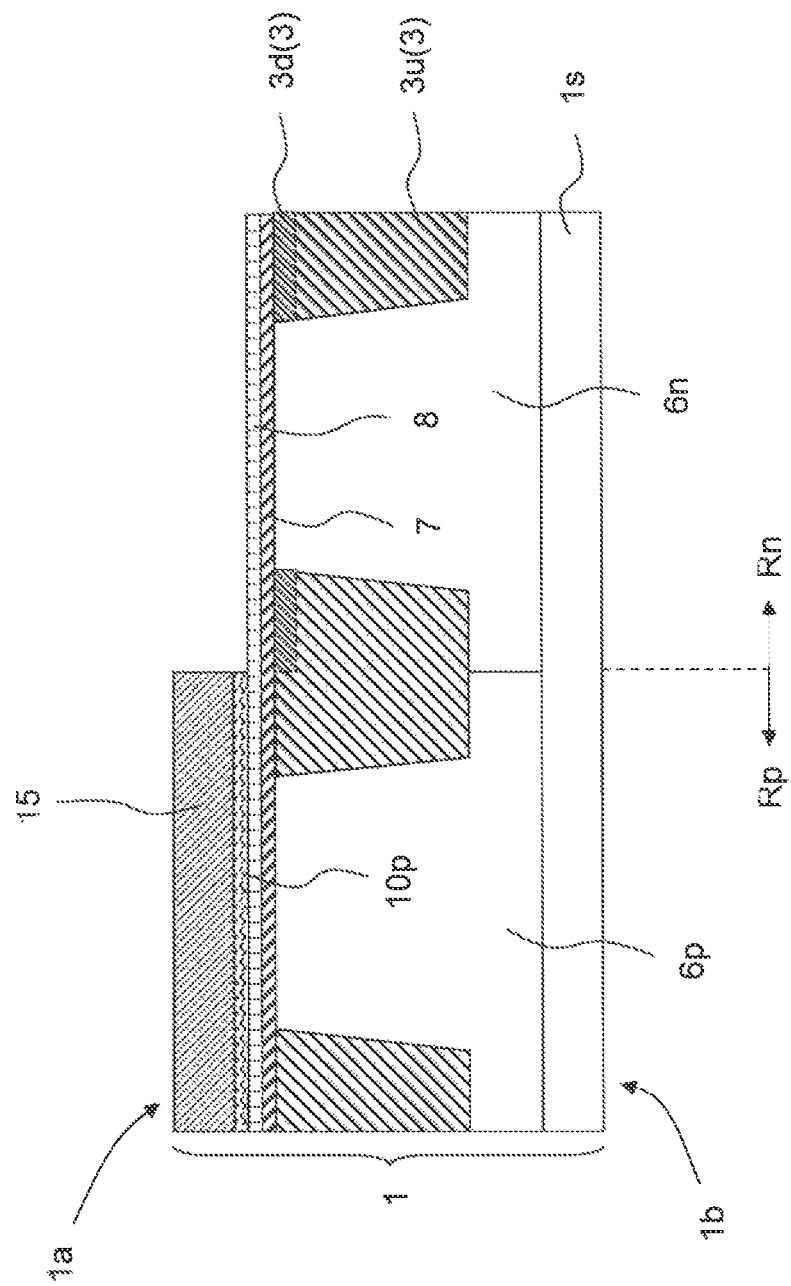
FIG. 10 is a device cross-sectional view (a step of processing the P channel threshold voltage adjusting film) corresponding to the X-X' cross-section of FIG. 1 for describing the main part process in the method (the N channel threshold voltage adjusting element ion implantation system) for manufacturing the semiconductor integrated circuit device according to the one embodiment of the present application.
Figure 11:
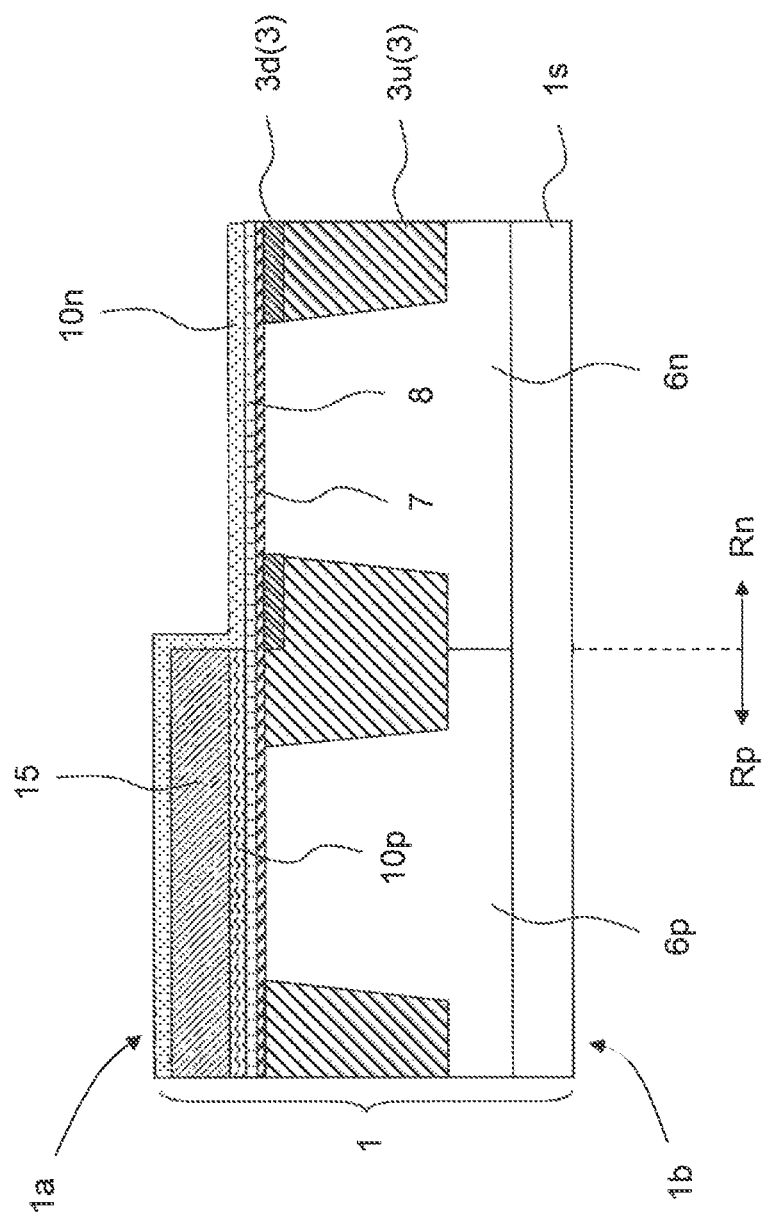
FIG. 11 is a device cross-sectional view (a step of forming an N channel threshold voltage adjusting film) corresponding to the X-X' cross-section of FIG. 1 for describing the main part process in the method (the N channel threshold voltage adjusting element ion implantation system) for manufacturing a semiconductor integrated circuit device according to the one embodiment of the present application.
Figure 12:
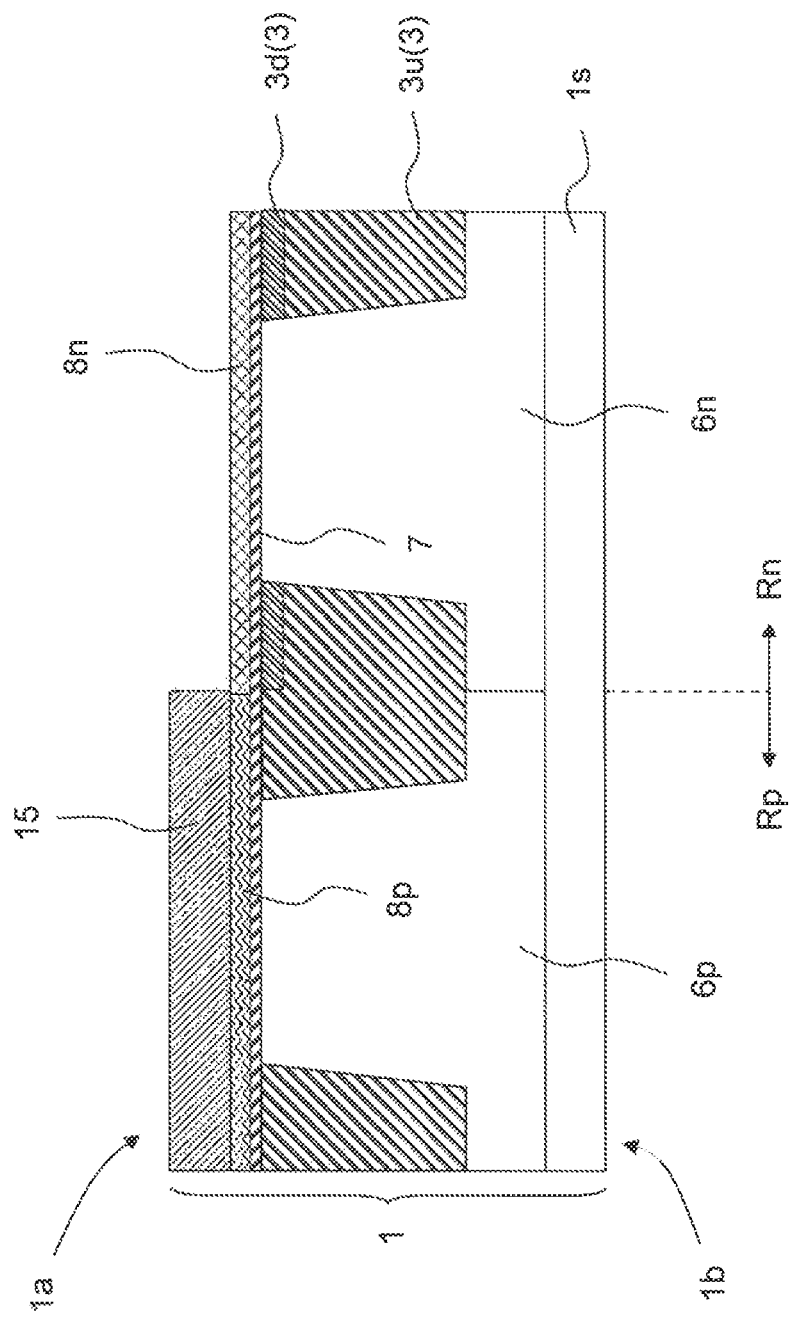
FIG. 12 is a device cross-sectional view (a step of removing the N channel threshold voltage adjusting film and the like) corresponding to the X-X' cross-section of FIG. 1 for describing the main part process in the method (the N channel threshold voltage adjusting element ion implantation system) for manufacturing the semiconductor integrated circuit device according to the one embodiment of the present application.
Figure 13:
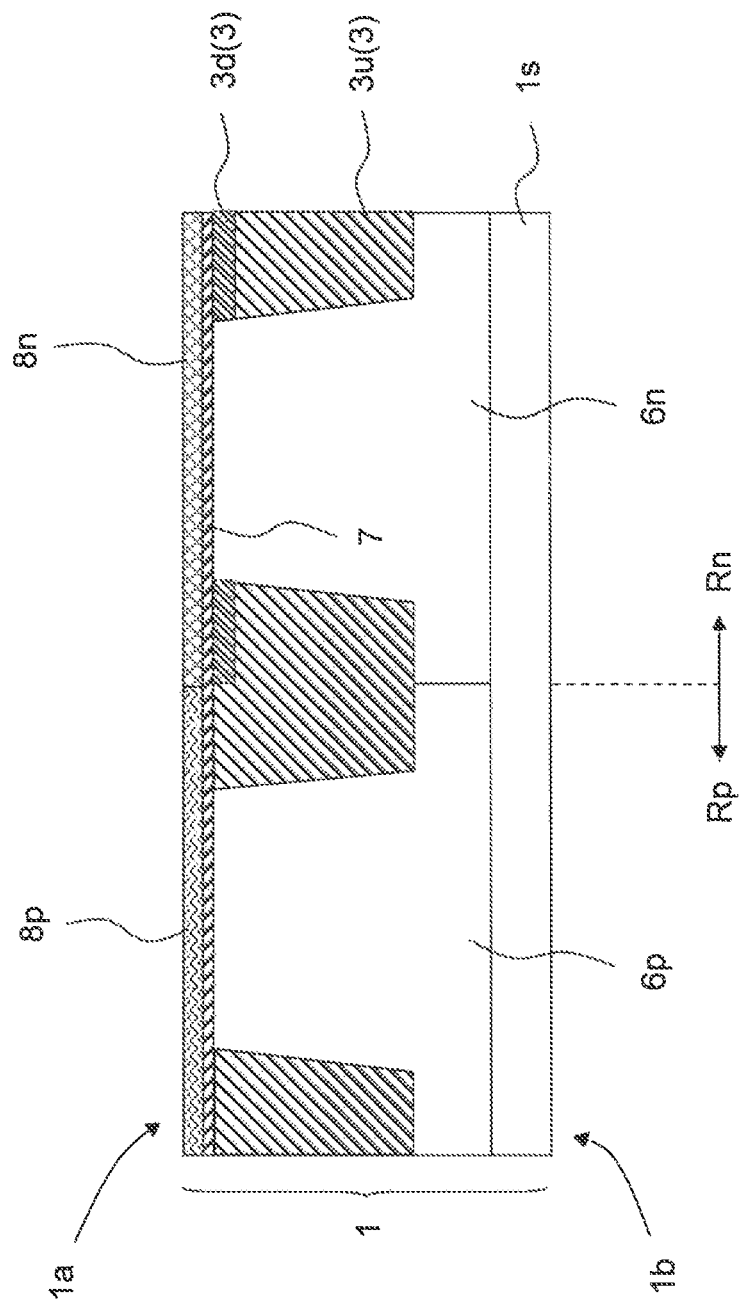
FIG. 13 is a device cross-sectional view (a step of removing the hardmask film for processing a P channel threshold voltage adjusting film) corresponding to the X-X' cross-section of FIG. 1 for describing the main part process in the method (the N channel threshold voltage adjusting element ion implantation system) for manufacturing a semiconductor integrated circuit device according to the one embodiment of the present application.
Figure 14:
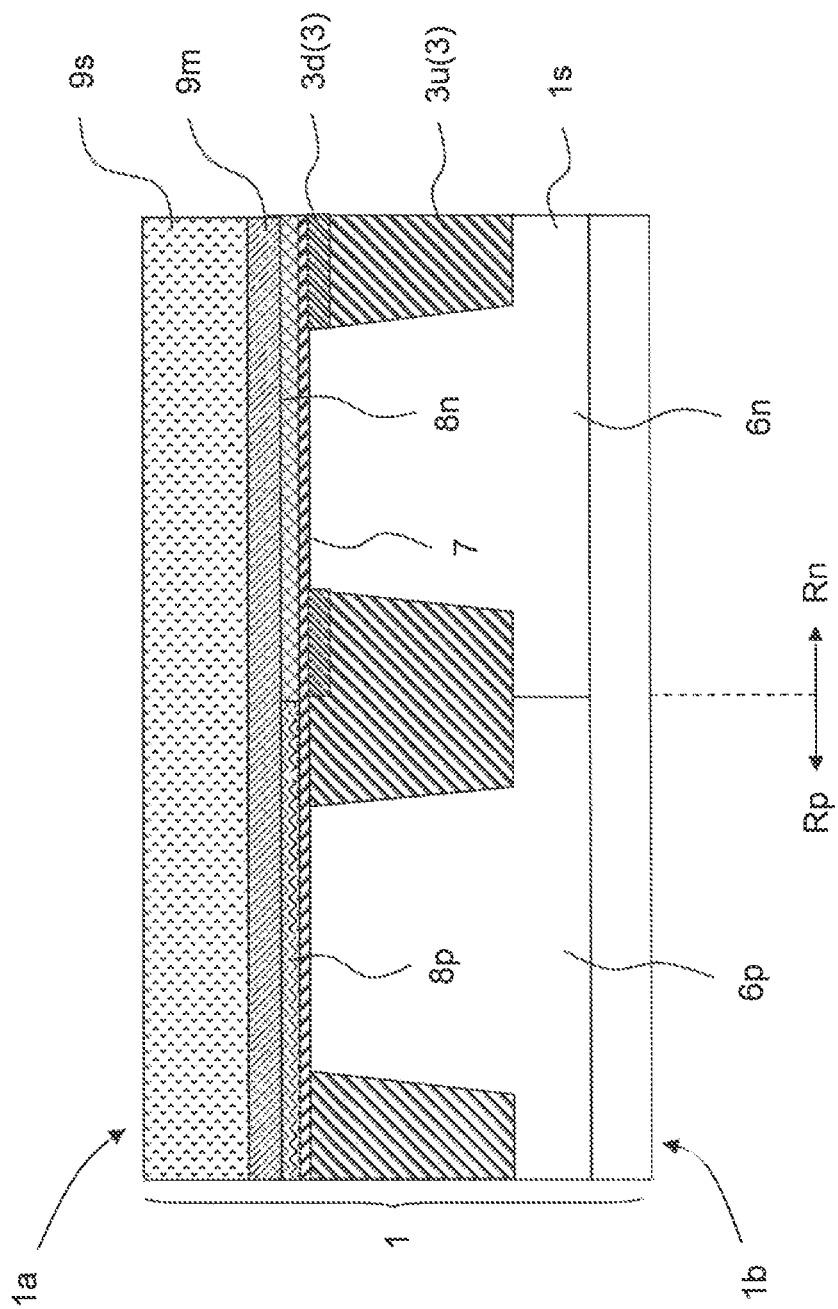
FIG. 14 is a device cross-sectional view (a step of forming a metal gate electrode film and a polysilicon gate electrode film) corresponding to the X-X' cross-section of FIG. 1 for describing the main part process in the method (the N channel threshold voltage adjusting element ion implantation system) for manufacturing the semiconductor integrated circuit device according to the one embodiment of the present application.
Figure 15:
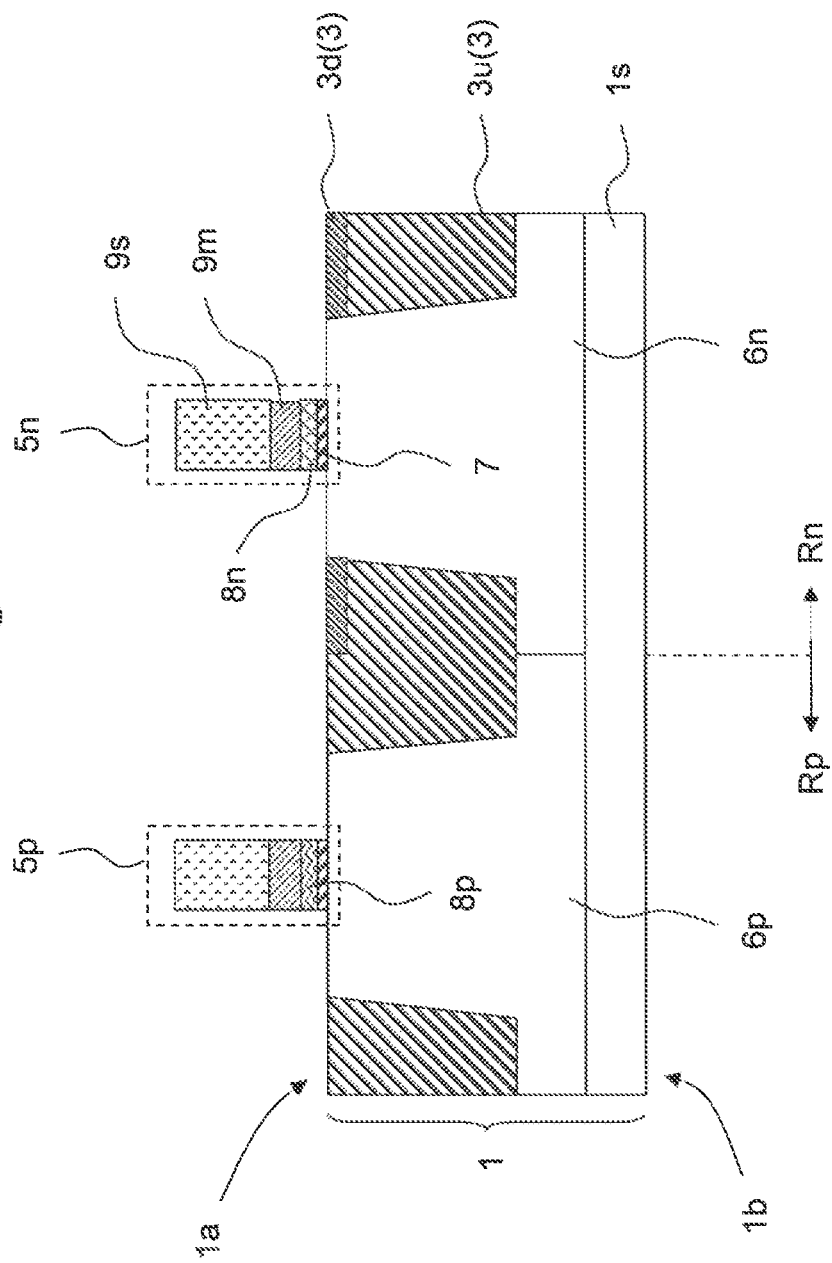
FIG. 15 is a device cross-sectional view (a gate patterning step) corresponding to the X-X' cross-section of FIG. 1 for describing the main part process in the method (the N channel threshold voltage adjusting element ion implantation system) for manufacturing the semiconductor integrated circuit device according to the one embodiment of the present application.

FIG. 4 is a device cross-sectional view (during formation of an STI region) corresponding to the X-X' cross-section of FIG. 1 for describing the main part process in a method (an N channel threshold voltage adjusting element ion implantation system) for manufacturing the semiconductor integrated circuit device according to the one embodiment of the present application. FIG. 5 is a device cross-sectional view (a step of implanting an N channel threshold voltage adjusting element ion) corresponding to the X-X' cross-section of FIG. 1 for describing the main part process in the method (the N channel threshold voltage adjusting element ion implantation system) for manufacturing the semiconductor integrated circuit device according to the one embodiment of the present application. FIG. 6 is a device cross-sectional view (a step of removing an STI forming silicon nitride film and the like) corresponding to the X-X' cross-section of FIG. 1 for describing the main part process in the method (the N channel threshold voltage adjusting element ion implantation system) for manufacturing the semiconductor integrated circuit device according to the one embodiment of the present application. FIG. 7 is a device cross-sectional view (a step of forming a well region) corresponding to the X-X' cross-section of FIG. 1 for describing the main part process in the method (the N channel threshold voltage adjusting element ion implantation system) for manufacturing the semiconductor integrated circuit device according to the one embodiment of the present application. FIG. 8 is a device cross-sectional view (a step of forming a resist film for a hardmask for processing a P channel threshold voltage adjusting film) corresponding to the X-X' cross-section of FIG. 1 for describing the main part process in the method (the N channel threshold voltage adjusting element ion implantation system) for manufacturing the semiconductor integrated circuit device according to the one embodiment of the present application. FIG. 9 is a device cross-sectional view (a step of processing the hardmask film for processing a P channel threshold voltage adjusting film) corresponding to the X-X' cross-section of FIG. 1 for describing the main part process in the method (the N channel threshold voltage adjusting element ion implantation system) for manufacturing a semiconductor integrated circuit device according to the one embodiment of the present application. FIG. 10 is a device cross-sectional view (a step of processing the P channel threshold voltage adjusting film) corresponding to the X-X' cross-section of FIG. 1 for describing the main part process in the method (the N channel threshold voltage adjusting element ion implantation system) for manufacturing the semiconductor integrated circuit device according to the one embodiment of the present application. FIG. 11 is a device cross-sectional view (step of forming an N channel threshold voltage adjusting film) corresponding to the X-X' cross-section of FIG. 1 describing the main part process in the method (N channel threshold voltage adjusting element ion implantation system) for manufacturing the semiconductor integrated circuit device according to the one embodiment of the present application. FIG. 12 is a device cross-sectional view (a step of removing the N channel threshold voltage adjusting film and the like) corresponding to the X-X' cross-section of FIG. 1 for describing the main part process in the method (the N channel threshold voltage adjusting element ion implantation system) for manufacturing the semiconductor integrated circuit device according to the one embodiment of the present application. FIG. 13 is a device cross-sectional view (a step of removing the hardmask film for processing a P channel threshold voltage adjusting film) corresponding to the X-X' cross-section of FIG. 1 for describing the main part process in the method (N channel threshold voltage adjusting element ion implantation system) for manufacturing the semiconductor integrated circuit device according to the one embodiment of the present application. FIG. 14 is a device cross-sectional view (a step of forming a metal gate electrode film and a polysilicon gate electrode film) corresponding to the X-X' cross-section of FIG. 1 for describing the main part process in the method (the N channel threshold voltage adjusting element ion implantation system) for manufacturing the semiconductor integrated circuit device according to the one embodiment of the present application. FIG. 15 is a device cross-sectional view (a gate patterning step) corresponding to the X-X' cross-section of FIG. 1 for describing the main part process in the method (the N channel threshold voltage adjusting element ion implantation system) for manufacturing the semiconductor integrated circuit device according to the one embodiment of the present application. Based on these drawings, the main part process in the method (N channel threshold voltage adjusting element ion implantation system) for manufacturing the semiconductor integrated circuit device according to the one embodiment of the present application will be described.

First, referring to FIG. 4, the STI process to obtain the state of FIG. 4 will be described. As a wafer 1 (substrate portion 1s), for example, a P type single crystal silicon wafer (having, for example, a specific resistance of from 1 to 10 Ωcm) is provided and a pad silicon oxide film 12 (having a thickness of, for example, about 10 nm) is formed, for example, by thermal oxidation on almost the whole surface on the side (side opposite to the back surface 1b) of the device surface (first main surface) 1a. Then, an STI forming silicon nitride film 11 (having a thickness of, for example, about 20 nm) is formed, for example, by CVD (Chemical Vapor Deposition) on almost the whole surface of the pad silicon oxide film 12. Next, conventional lithography (for example, ArF lithography) is conducted to pattern the STI forming silicon nitride film 11 and the pad silicon oxide film 12 to form a trench forming opening (having a width of, for example, about 70 nm). Next, with the STI forming silicon nitride film 11 and the like thus patterned as a mask, a trench (having a depth of, for example, about 300 nm) is formed by anisotropic dry etching using, for example, a halogen-based etching gas. Next, a liner silicon oxide film (having a thickness of, for example, about 3 nm) is formed in the trench, for example, by thermal oxidation. Then, a burying silicon oxide-based film is formed on almost the whole surface and in the trench on the side of the device surface 1a of the wafer 1, for example, by HDP (High Density Plasma)-CVD. Next, the surface planarization is conducted, for example, by CMP (Chemical Mechanical Polishing) and it is stopped on the STI forming silicon nitride film 11. Then, the burying silicon oxide film on the trench is removed using a hydrofluoric acid-based etching solution to leave an STI region 3 (element isolation region) in the trench as shown in FIG. 4.

Next, as shown in FIG. 5, conventional lithography (for example, ArF lithography) is conducted to pattern an N channel threshold voltage adjusting element introducing resist film 14 (having a thickness of, for example, about 300 nm). With the thus-patterned N channel threshold voltage adjusting element introducing resist film 14 as an ion implantation mask, for example, lanthanum ions are implanted in the surface of the STI region 3 corresponding to an N channel device region Rn to form an N channel threshold voltage adjusting element introduced region 3d (N channel threshold voltage adjusting element outward diffusion preventing region). Preferable ion implantation conditions are, for example, as follows: ion species: lanthanum, implantation energy: about 150 KeV, dosage: $5\times10^{14}/cm^2$, and the like (for example, a range of the implantation energy is from about 50 to 300 KeV and a range of dosage is from $5\times10^{13}/cm^2$ to $5\times10^{15}/cm^2$). Thus, lanthanum ions are implanted while the STI forming silicon nitride film 11 and the pad silicon oxide film 12 are present so that this method has the advantage that undesired introduction of lanthanum or the like into the N channel active region 4n can be prevented.

The N channel threshold voltage adjusting element introducing resist film 14 which becomes unnecessary is then removed, for example, by ashing. Then, the STI forming silicon nitride film 11 is removed using, for example, hot phosphoric acid or the like, followed by etch back of the device surface 1a of the wafer 1 by using, for example, a hydrophosphoric acid-based etching solution to remove the pad silicon oxide film 12 and the like as shown in FIG. 6.

Next, as shown in FIG. 7, ion implantation is conducted from the side of the device surface 1a of the wafer 1 to form an N well region 6n and a P well region 6p in a portion corresponding to the N channel device region Rn and a portion corresponding to the P channel device region Rp, respectively, on the side of the device surface 1a of the semiconductor substrate portion 1s.

Next, as shown in FIG. 8, a silicon oxide-based insulating film 7 (for example, a silicon oxynitride film having a thickness of about 1 nm) is forms as IL (interfacial silicon oxide-based insulating film) on almost the whole surface of the semiconductor surface of the device surface 1a of the wafer 1, for example, by thermal oxidation. Then, a non-doped High-k gate insulating film 8 (for example, a hafnium oxide-based High-k gate insulating film having a thickness of about 2 nm) is formed on almost the whole surface of the interfacial silicon oxide-based insulating film 7, for example, by ALD (Atomic Layer deposition). Then, a P channel threshold voltage adjusting film 10p (for example, an alumina film having a thickness of about 1 nm) is formed on almost the whole surface of the non-doped High-k gate insulating film 8 by sputtering film formation. Next, a metal cap film or a P channel threshold voltage adjusting film processing hardmask film 15 (for example, a TiN film having a thickness of about 10 nm) is formed on almost the whole surface of the P channel threshold voltage adjusting film 10p, for example, by reactive sputtering film formation. Then, a P channel threshold voltage adjusting film processing hardmask resist film 16 (having a thickness of, for example, about 300 nm) is formed on the P channel threshold voltage adjusting film processing hardmask film 15, followed by patterning by using conventional lithography (for example, ArF lithography).

Next, as shown in FIG. 9, with the P channel threshold voltage adjusting film processing hardmask resist film 16 as a mask, the P channel threshold voltage adjusting film processing hardmask film 15 is patterned, for example, by wet etching. Then, the P channel threshold voltage adjusting film processing hardmask resist film 16 which becomes unnecessary is removed.

Next, as shown in FIG. 10, with the P channel threshold voltage adjusting film processing hardmask film 15 as a mask, the P channel threshold voltage adjusting film 10p is removed from the side of the N channel device region Rn, for example, by wet etching. Preferred examples of the wet etching solution usable here include SPM (Sulfuric Acid Hydrogen Peroxide Mixture).

Next, as shown in FIG. 11, an N channel threshold voltage adjusting film 10n (for example, a lanthanum oxide film having a thickness of about 1 nm) is formed on almost the whole surface of the wafer 1 on the side of the device surface 1a, for example, by using sputtering film formation. Then, heat treatment (for example, RTA treatment of about 850° C.) is conducted to convert the non-doped High-k gate insulating film 8 of the N channel device region Rn into an N channel High-k gate insulating film 8n (lanthanum-added hafnium oxide-based High-k gate insulating film) as shown in FIG. 12. On the other hand, the non-doped High-k gate insulating film 8 of the P channel device region Rp is converted to a P channel High-k gate insulating film 8p (aluminum-added hafnium oxide-based High-k gate insulating film). Next, the P channel threshold voltage adjusting film processing hardmask film 15 which becomes unnecessary is removed, for example, by wet etching as shown in FIG. 13. Preferred examples of the wet etching solution usable here include SPM.

Next, as shown in FIG. 14, a metal gate electrode film 9m (for example, a TiN film having a thickness of about 10 nm) is formed on the N channel High-k gate insulating film 8n and the P channel High-k gate insulating film 8p on almost the whole surface of the wafer 1 on the side of the device surface 1a, for example, by reactive sputtering film formation. Then a polysilicon gate electrode film 9s (for example, a polysilicon film or amorphous silicon film having a thickness of 10 nm) on almost the whole surface of the metal gate electrode film 9m, for example, by CVD.

Next, as shown in FIG. 15, an N channel gate stack 5n and a P channel gate stack 5p are patterned by using conventional lithography (for example, ArF lithography) and anisotropic dry etching in combination. Preferred examples of the etching gas include halogen-based etching gases such as HBR as an etching gas of the polysilicon gate electrode film 9s, halogen-based etching gases such as $Cl_2$/HBr as an etching gas of the metal gate electrode film 9m, and halogen-based etching gases such as $BCl_3$/$Cl_2$ as an etching gas of the High-k gate insulating film 8 (8n, 8p).

Then, after formation of a gate structure including a gate side-surface structure, introduction of a source drain region, and the like, formation of a pre-metal (Pre-metal) insulating film, formation of a contact hole, burying of a tungsten plug and the like are conducted in the gate first system, followed by a step of a copper-based buried wiring according to a damascene system or the like.

3. Description on Modification Example 1 of a method for manufacturing the semiconductor integrated circuit device according to the one embodiment of the present application (principal system for the formation of an N channel threshold voltage adjusting element-containing film) (mainly from FIG. 16 to FIG. 19)

In Section 2, the method of implanting ions of an N channel threshold voltage adjusting element such as lanthanum was described as a method of manufacturing a device capable of actualizing the device structure of Section 1. In this section, as a modification example of it, a method of introducing an N channel threshold voltage adjusting element from an N channel threshold voltage adjusting element-containing film will be described. It is needless to say that using this modification example in combination of the method of Section 2 is not excluded.

Figure 16:
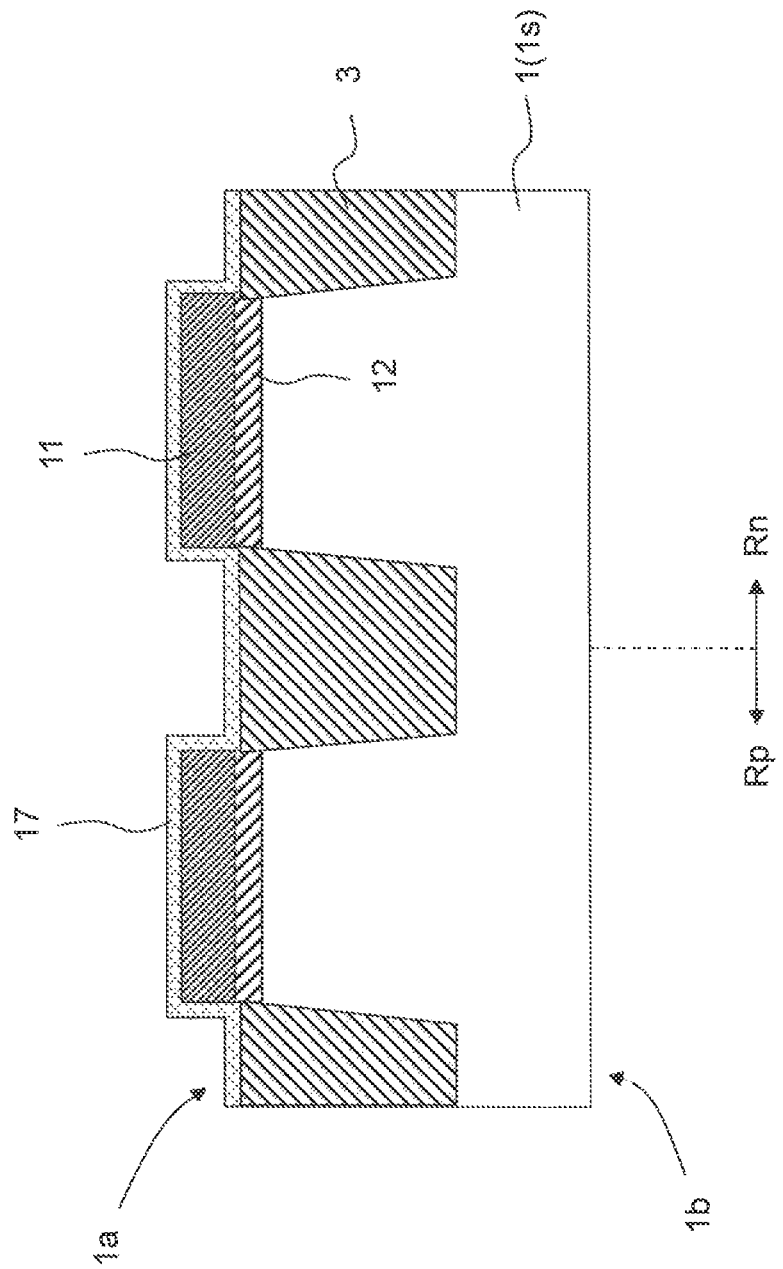
FIG. 16 is a device cross-sectional view (a step of forming an N channel threshold voltage adjusting element-containing film) corresponding to the X-X' cross-section of FIG. 1 for describing the main part process in a method (an N channel threshold voltage adjusting element ion implantation system) for manufacturing the semiconductor integrated circuit device according to the one embodiment of the present application.
Figure 17:
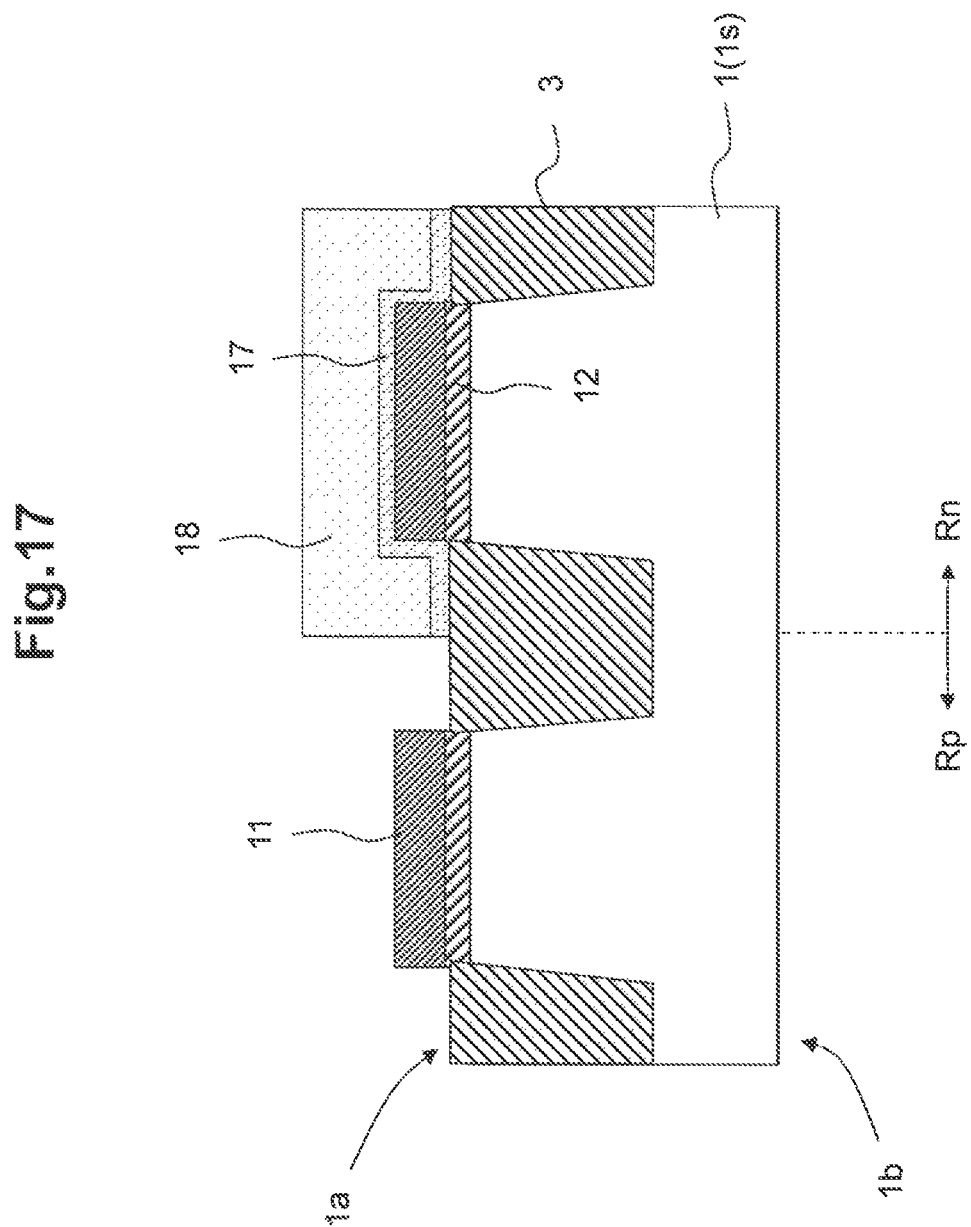
FIG. 17 is a device cross-sectional view (a step of patterning the N channel threshold voltage adjusting element-containing film) corresponding to the X-X' cross-section of FIG. 1 for describing the main part process in the method (the N channel threshold voltage adjusting element ion implantation system) for manufacturing the semiconductor integrated circuit device according to the one embodiment of the present application.
Figure 18:
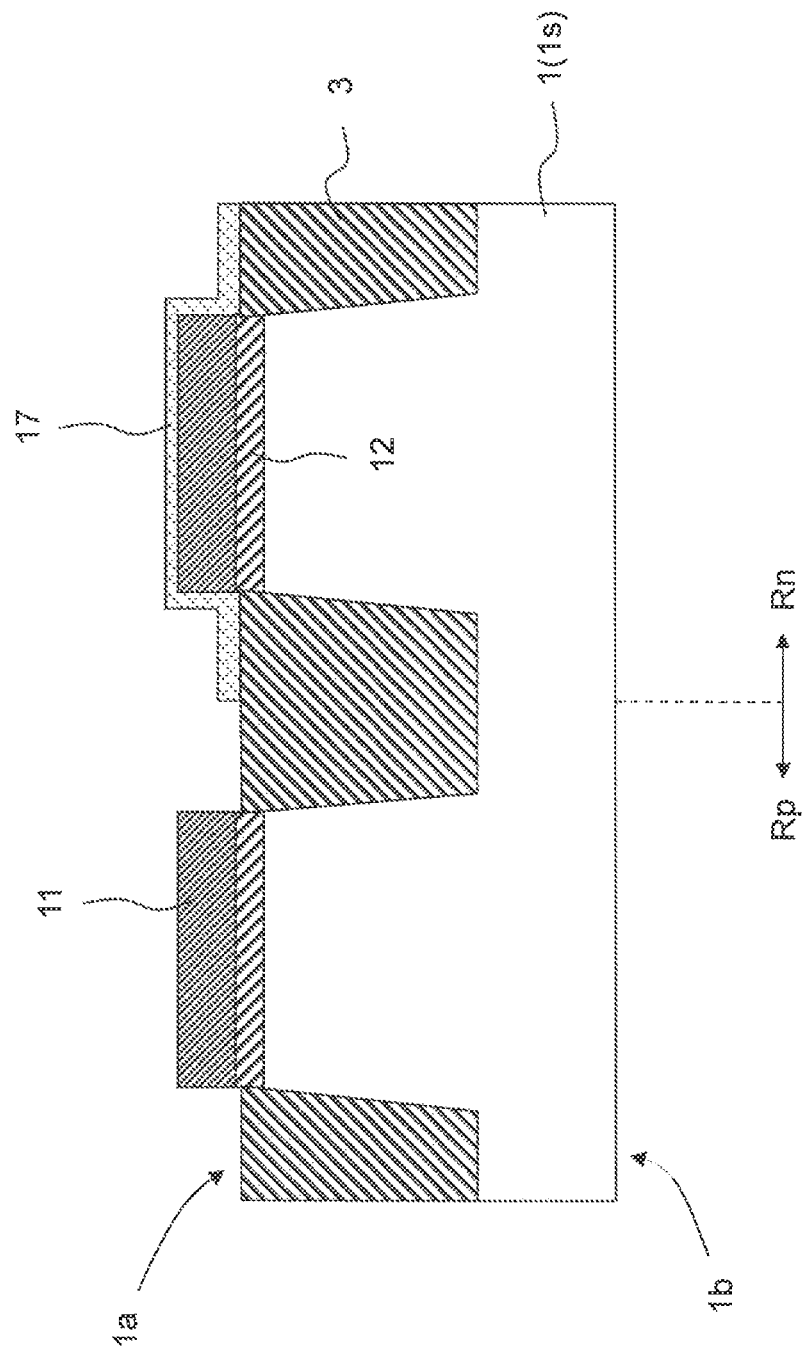
FIG. 18 is a device cross-sectional view (a heat treatment step after patterning of the N channel threshold voltage adjusting element-containing film) corresponding to the X-X' cross-section of FIG. 1 for describing the main part process in the method (the N channel threshold voltage adjusting element ion implantation system) for manufacturing the semiconductor integrated circuit device according to the one embodiment of the present application.
Figure 19:
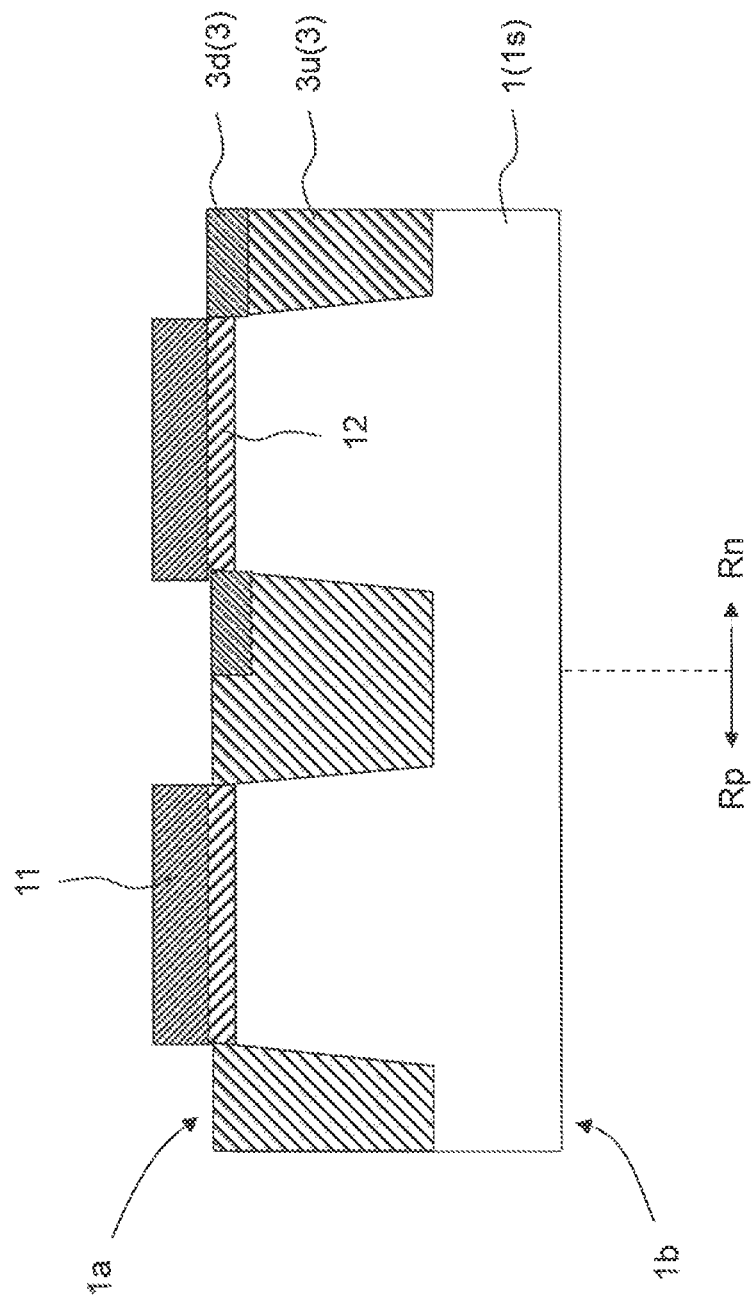
FIG. 19 is a device cross-sectional view (a step of removing the N channel threshold voltage adjusting element-containing film) corresponding to the X-X' cross-section of FIG. 1 for describing the main part process in the method (the N channel threshold voltage adjusting element ion implantation system) for manufacturing the semiconductor integrated circuit device according to the one embodiment of the present application.

FIG. 16 is a device cross-sectional view (a step of forming an N channel threshold voltage adjusting element-containing film) corresponding to the X-X' cross-section of FIG. 1 for describing the main part process in the method (the N channel threshold voltage adjusting element ion implantation system) for manufacturing the semiconductor integrated circuit device according to the one embodiment of the present application. FIG. 17 is a device cross-sectional view (a step of patterning the N channel threshold voltage adjusting element-containing film) corresponding to the X-X' cross-section of FIG. 1 for describing the main part process in the method (the N channel threshold voltage adjusting element ion implantation system) for manufacturing the semiconductor integrated circuit device according to the one embodiment of the present application. FIG. 18 is a device cross-sectional view (a heat treatment step after patterning of the N channel threshold voltage adjusting element-containing film) corresponding to the X-X' cross-section of FIG. 1 for describing the main part process in the method (the N channel threshold voltage adjusting element ion implantation system) for manufacturing the semiconductor integrated circuit device according to the one embodiment of the present application. FIG. 19 is a device cross-sectional view (a step of removing the N channel threshold voltage adjusting element-containing film) corresponding to the X-X' cross-section of FIG. 1 for describing the main part process in the method (the N channel threshold voltage adjusting element ion implantation system) for manufacturing the semiconductor integrated circuit device according to the one embodiment of the present application.

After the device as shown in FIG. 4, an N channel threshold voltage adjusting element-containing film 17 (for example, a lanthanum oxide film having a thickness of about 1 nm) is formed on almost the whole surface of the wafer 1 on the side of the device surface 1a, for example, by sputtering film formation as shown in FIG. 16.

Next, as shown in FIG. 17, an N channel threshold voltage adjusting element-containing film processing resist film 17 (having a thickness of, for example, about 300 nm) is patterned using conventional lithography (for example, ArF lithography). With the thus-patterned N channel threshold voltage adjusting element-containing film processing resist film 17 as a mask, the N channel threshold voltage adjusting element-containing film 17 on the P channel device region Rp is removed, for example, by wet etching. Preferred examples of the wet etching solution usable here include SPM. Then, the N channel threshold voltage adjusting element-containing film processing resist film 17 which becomes unnecessary is removed, for example, by ashing as shown in FIG. 18.

When heat treatment (for example, RTA treatment at about 850° C.) is conducted under such a state, an N channel threshold voltage adjusting element introduced region 3d (N channel threshold voltage adjusting element outward diffusion preventing region) is formed in the surface region of the STI region 3 (element isolation region) and the element isolation region 3 therefore has this region and an originally present region, that is, an N channel threshold voltage adjusting element non-introduced region 3u. As in the above-mentioned method, this step is followed by the step of FIG. 6.

Thus, compared with the ion implantation system (N channel threshold voltage adjusting element ion implantation system), the method of introducing an N channel threshold voltage adjusting element from an N channel threshold voltage adjusting element-containing film has the advantage that a high concentration N channel threshold voltage adjusting element-containing region 3d can be formed relatively easily.

4. Description on Modification Example 2 (N channel threshold voltage adjusting element-containing film formation and sidewall system) of the method for manufacturing the semiconductor integrated circuit device according to the one embodiment of the present application (mainly from FIG. 20 to FIG. 22)

This section describes an N channel threshold voltage adjusting element-containing film formation & sidewall system. It is, similar to Section 3, an N channel threshold voltage adjusting element-containing film formation system but in this system, the N channel threshold voltage adjusting element-introduced region 3d can be limited only to a region which is present in the surface of the element isolation region 3 of the N channel device region Rn in the vicinity of the N channel active region 4n.

Figure 20:
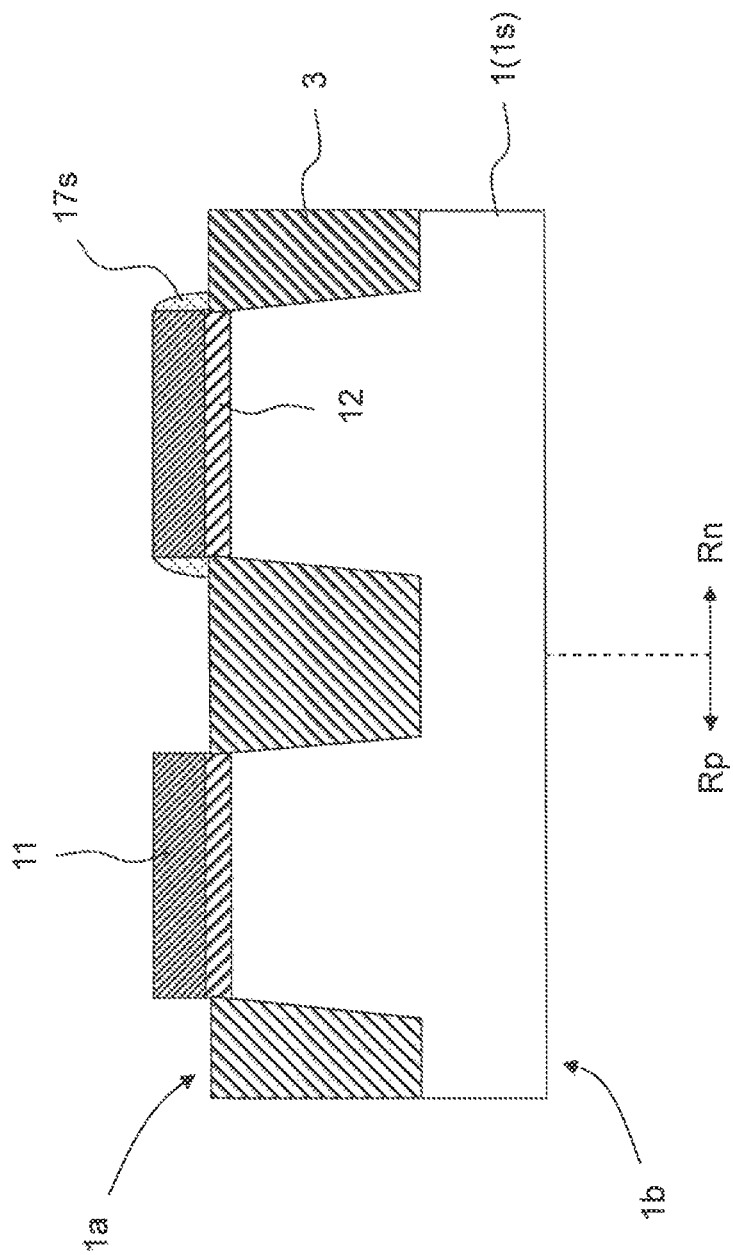
FIG. 20 is a device cross-sectional view (a step of forming an N channel threshold voltage adjusting element-containing film sidewall) corresponding to the X-X' cross-section of FIG. 1 for describing the main part process in a method (an N channel threshold voltage adjusting element ion implantation system) for manufacturing the semiconductor integrated circuit device according to the one embodiment of the present application.
Figure 21:
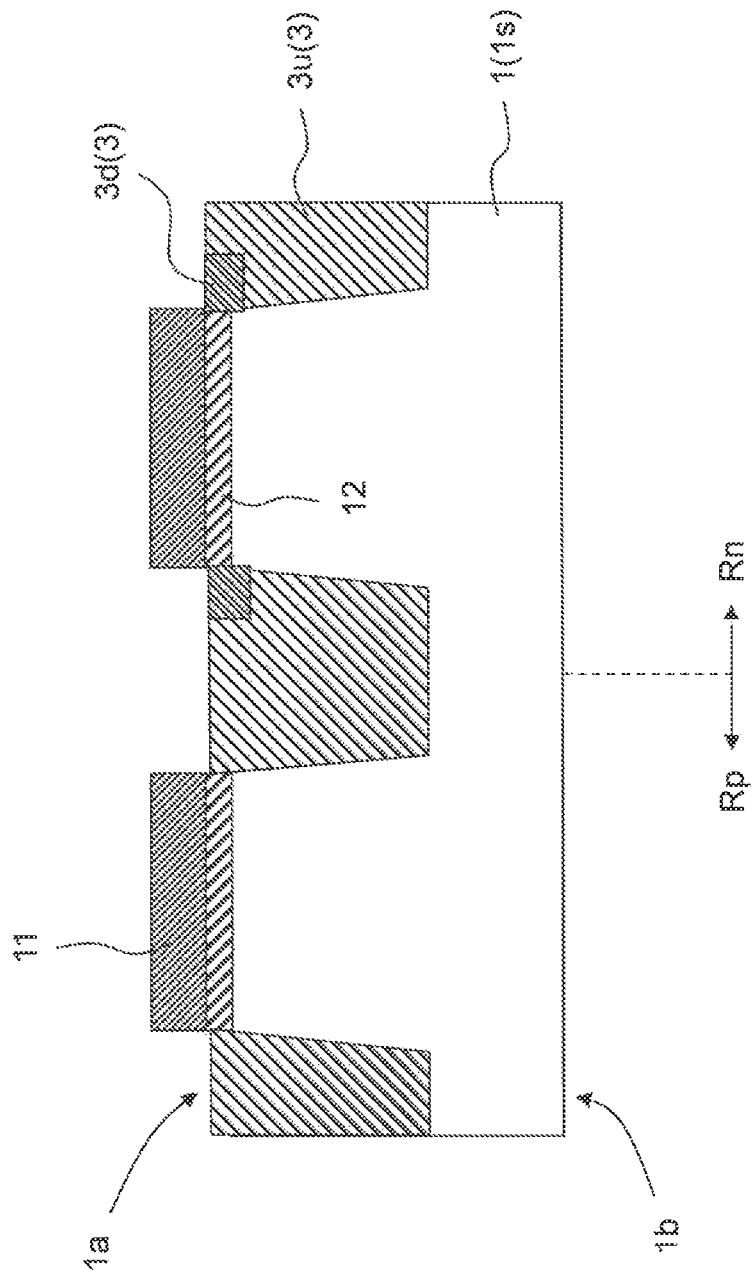
FIG. 21 is a device cross-sectional view (a step of removing the N channel threshold voltage adjusting element-containing film sidewall) corresponding to the X-X' cross-section of FIG. 1 for describing the main part process in the method (the N channel threshold voltage adjusting element ion implantation system) for manufacturing the semiconductor integrated circuit device according to the one embodiment of the present application.
Figure 22:
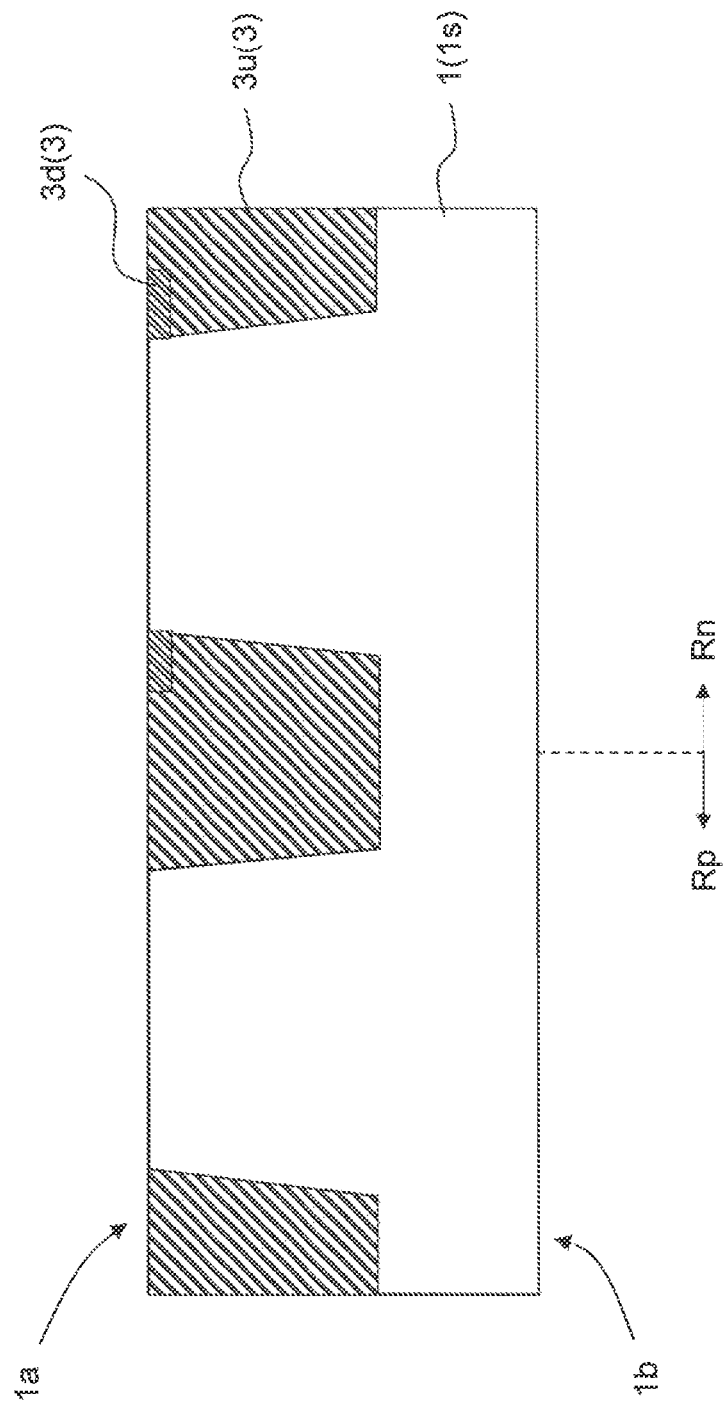
FIG. 22 is a device cross-sectional view (a step of removing the STI forming silicon nitride film and the like) corresponding to the X-X' cross-section of FIG. 1 for describing the main part process in the method (the N channel threshold voltage adjusting element ion implantation system) for manufacturing the semiconductor integrated circuit device according to the one embodiment of the present application.

FIG. 20 is a device cross-sectional view (a step of forming an N channel threshold voltage adjusting element-containing film sidewall) corresponding to the X-X' cross-section of FIG. 1 for describing the main part process in the method (the N channel threshold voltage adjusting element ion implantation system) for manufacturing the semiconductor integrated circuit device according to the one embodiment of the present application. FIG. 21 is a device cross-sectional view (a step of removing the N channel threshold voltage adjusting element-containing film sidewall) corresponding to the X-X' cross-section of FIG. 1 for describing the main part process in the method (the N channel threshold voltage adjusting element ion implantation system) for manufacturing a semiconductor integrated circuit device according to the one embodiment of the present application. FIG. 22 is a device cross-sectional view (a step of removing the STI forming silicon nitride film and the like) corresponding to the X-X' cross-section of FIG. 1 for describing the main part process in method (the N channel threshold voltage adjusting element ion implantation system) for manufacturing the semiconductor integrated circuit device according to the one embodiment of the present application. Referring to these drawings, Modification Example 2 (N channel threshold voltage adjusting element-containing film formation & sidewall system) of the method for manufacturing the semiconductor integrated circuit device according the one embodiment of the present invention will next be described.

After the state of FIG. 18, the N channel threshold voltage adjusting element-containing film 17 (lanthanum oxide film) is subjected to anisotropic dry etching to form an N-channel threshold voltage adjusting element-containing film sidewall 17*s* as shown in FIG. 20.

Next, as shown in FIG. 21, heat treatment (for example, RTA treatment at about 850° C. or the like treatment) is conducted to form, in the surface region of the STI region 3 (element isolation region), an N channel threshold voltage adjusting element-introduced region 3*d* (N channel threshold voltage adjusting element outward diffusion preventing region). As a result, the element isolation region 3 has, as described above, this region and an originally present N channel threshold voltage adjusting element non-introduced region 3*u*.

Next, as shown in FIG. 22, the STI forming silicon nitride film 11 is removed, for example, by hot phosphoric acid and the pad silicon oxide film 12 and the like are removed by etching back the device surface 1*a* of the wafer 1 with a hydrofluoric acid-based etching solution.

By using such a structure, it is possible to reduce the adverse effect of the N channel threshold voltage adjusting element on the P channel device region Rp because the N channel threshold voltage adjusting element introduced region 3*d* can be limited only to a region which is in the surface of the element isolation region 3 of the N channel device region Rn in the vicinity of the N channel active region 4*n*.

5. Description on Modification Example 3 (N channel threshold voltage adjusting element-containing film formation and hardmask system) of a method for manufacturing the semiconductor integrated circuit device according to the one embodiment of the present application (mainly from FIG. 23 to FIG. 26)

The example described in this section is a modification example of the manufacturing method described in Section 3, which is characterized in that a hardmask is used for selective introduction of lanthanum or the like. This example is advantageous for the processing of a product having a large step difference such as SRAM (Static Random Access Memory).

Figure 23:
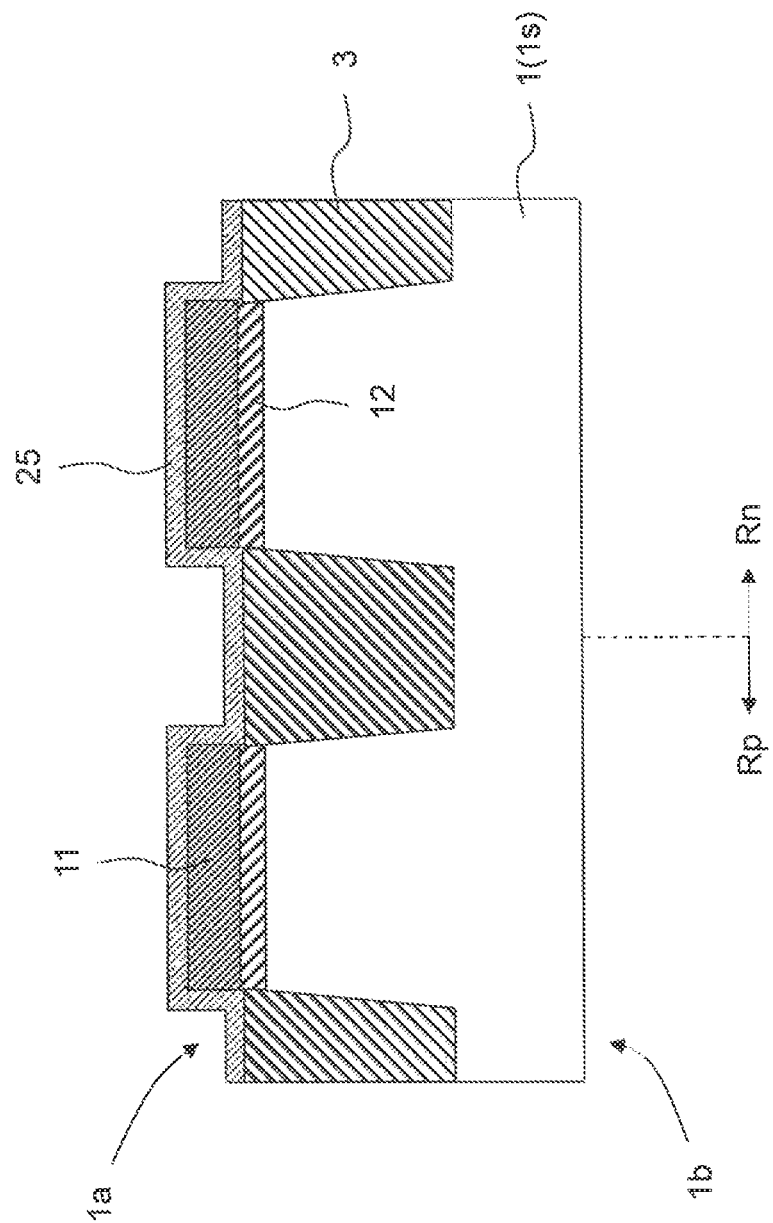
FIG. 23 is a device cross-sectional view (a step of forming a P channel device region covering hardmask film) corresponding to the X-X' cross-section of FIG. 1 for describing Modification Example 3 (a system of N channel threshold voltage adjusting element-containing film formation & a hardmask) of a method for manufacturing the semiconductor integrated circuit device according to the one embodiment of the present application.
Figure 24:
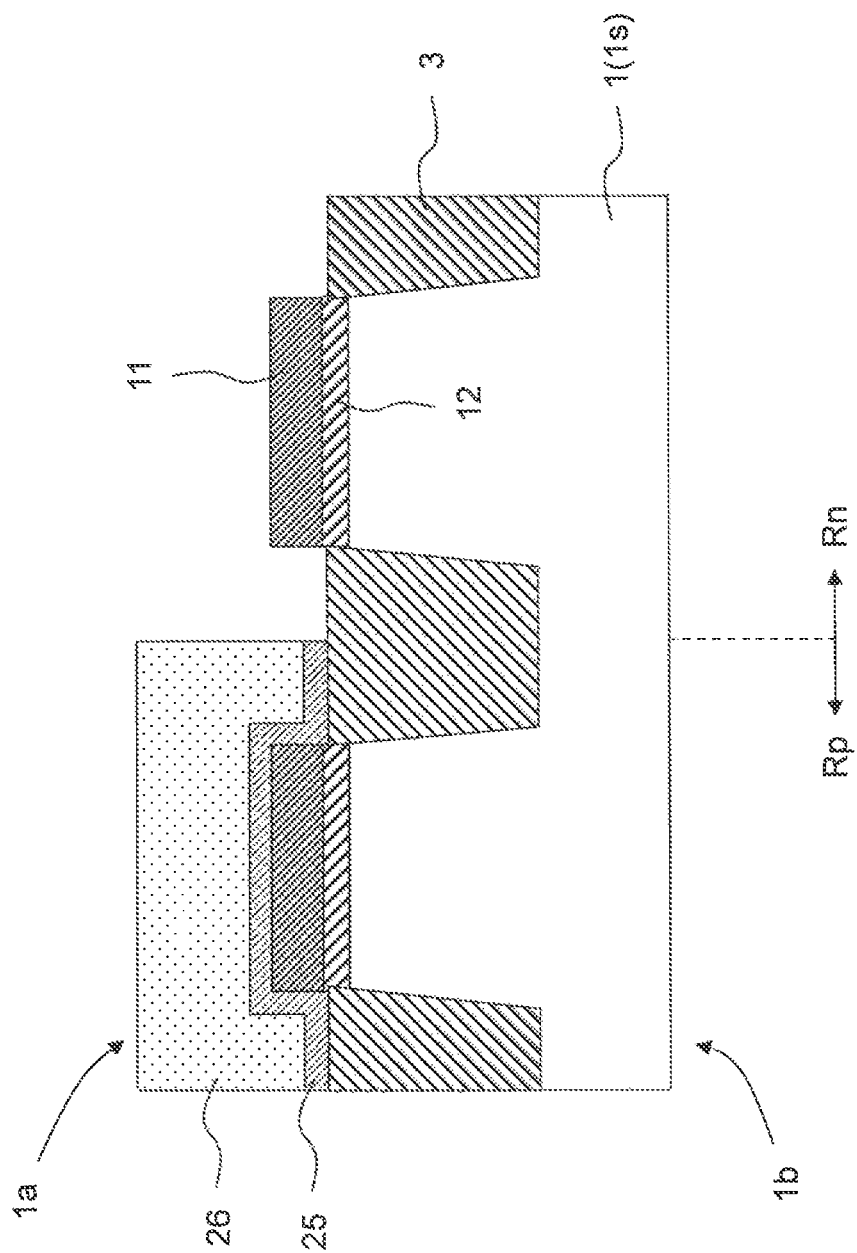
FIG. 24 is a device cross-sectional view (a step of patterning the P channel device region covering hardmask film) corresponding to the X-X' cross-section of FIG. 1 for describing Modification Example 3 (the system of N channel threshold voltage adjusting element-containing film formation & a hardmask) of the method for manufacturing the semiconductor integrated circuit device according to the one embodiment of the present application.
Figure 25:
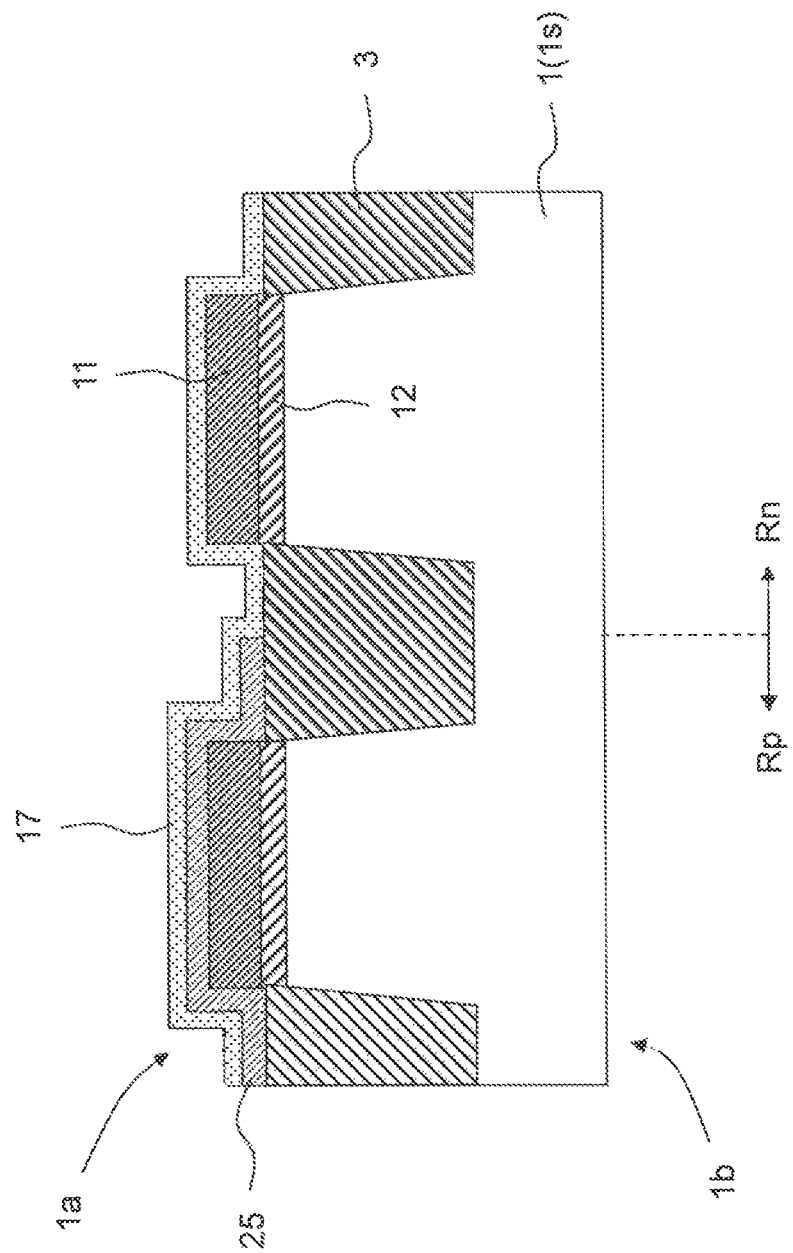
FIG. 25 is a device cross-sectional view (a step of forming an N channel threshold voltage adjusting element-containing film) corresponding to the X-X' cross-section of FIG. 1 for describing Modification Example 3 (the system of N channel threshold voltage adjusting element-containing film formation & hardmask) of the method for manufacturing the semiconductor integrated circuit device according to the one embodiment of the present application.
Figure 26:
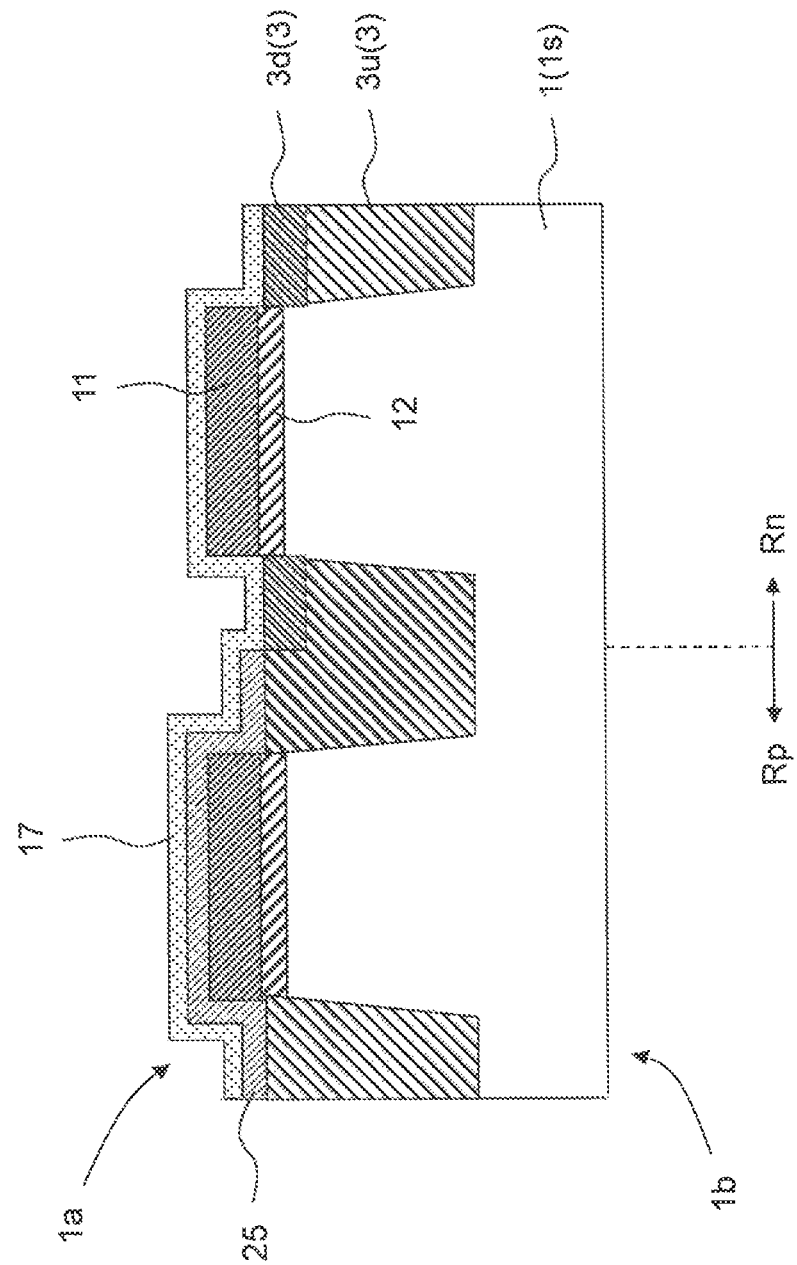
FIG. 26 is a device cross-sectional view (a heat treatment step after formation of the N channel threshold voltage adjusting element-containing film) corresponding to the X-X' cross-section of FIG. 1 for describing Modification Example 3 (the system of N channel threshold voltage adjusting element-containing film formation & a hardmask) of the method for manufacturing the semiconductor integrated circuit device according to the one embodiment of the present application.

FIG. 23 is a device cross-sectional view (a step of forming a P channel device region covering hardmask film) corresponding to the X-X' cross-section of FIG. 1 for describing Modification Example 3 (a system of N channel threshold voltage adjusting element-containing film formation & hardmask) of the method for manufacturing the semiconductor integrated circuit device according to the one embodiment of the present application. FIG. 24 is a device cross-sectional view (a step of patterning the P channel device region covering hardmask film) corresponding to the X-X' cross-section of FIG. 1 for describing Modification Example 3 (the system of N channel threshold voltage adjusting element-containing film formation & hardmask) of the method for manufacturing a semiconductor integrated circuit device according to the one embodiment of the present application. FIG. 25 is a device cross-sectional view (a step of forming an N channel threshold voltage adjusting element-containing film) corresponding to the X-X' cross-section of FIG. 1 for describing Modification Example 3 (the system of N channel threshold voltage adjusting element-containing film formation & hardmask) of the method for manufacturing the semiconductor integrated circuit device according to the one embodiment of the present application. FIG. 26 is a device cross-sectional view (a heat treatment step after formation of the N channel threshold voltage adjusting element-containing film) corresponding to the X-X' cross-section of FIG. 1 for describing Modification Example 3 (the system of N channel threshold voltage adjusting element-containing film formation & hardmask) of the method for manufacturing the semiconductor integrated circuit device according to the one embodiment of the present application. Referring to these drawings, Modification Example 3 (N channel threshold voltage adjusting element-containing film formation & hardmask system) of the method for manufacturing the semiconductor integrated circuit device according to the one embodiment of the present application will be described.

After the state shown in FIG. 4, as shown in FIG. 23, a cap film or a P channel device region covering hardmask film 25 (for example, a TiN film having a thickness of about 10 nm) is formed using reactive sputtering film formation on almost the whole surface of the wafer 1 on the side of the device surface 1*a* thereof. Preferred examples of the P channel device region covering hardmask film 25 include, in addition to a TiN film, a TaN film.

Next, as shown in FIG. 24, the P channel device region covering hardmask processing resist film 26 (having a thickness of, for example, about 300 nm) is patterned using, for example, conventional lithography (for example, ArF lithography). Then, with the resulting patterned P channel device region covering hardmask processing resist film 26 as a mask, the P channel device region covering hardmask film 25 is removed from the N channel device region Rn, for example, by wet etching. Preferred examples of the wet etching solution include SPM. Then, the P channel device region covering hardmask processing resist film 26 which becomes unnecessary is removed, for example, by ashing.

Next, as shown in FIG. 25, an N channel threshold voltage adjusting element-containing film 17 (for example, a lanthanum oxide film having a thickness of about 1 nm) is formed, for example, by using sputtering on almost all the surface of the wafer 1 on the side of the device surface 1*a*.

Next, as shown in FIG. 26, heat treatment (for example, RTA treatment at about 850° C.) is conducted to form an N channel threshold voltage adjusting element-introduced region 3*d* (N channel threshold voltage adjusting element outward diffusion preventing region) in the surface region of the STI region 3 (element isolation region). As a result, the element isolation region 3 has, similar to the above-described one, both this region and an originally present N channel threshold voltage adjusting element non-introduced region 3*u*.

Then, similar to the above-mentioned case, the N channel threshold voltage adjusting element-containing film 17 and the P channel device region covering hardmask film 25 are removed using, for example, wet etching with SPM. This removal is followed by the process of FIG. 6.

Such a process can provide improved pattern accuracy compared with that provided by direct patterning of the N channel threshold voltage adjusting element-containing film 17 with a resist film.

6. Description on modification example (nitrogen-doped STI structure) of the device structure of the semiconductor integrated circuit device according to the one embodiment of the present application (mainly, from FIG. 27 to FIG. 29)

This section describes a modification example of the device structure described in Section 1. In the example of Section 1, the N channel threshold voltage adjusting element-introduced region 3d (From FIG. 1 to FIG. 3) is used as the N channel threshold voltage adjusting element outward diffusion preventing region, while in the example of this section, a nitrogen introduced region 3n (From FIG. 27 to FIG. 29) is used instead.

Figure 27:
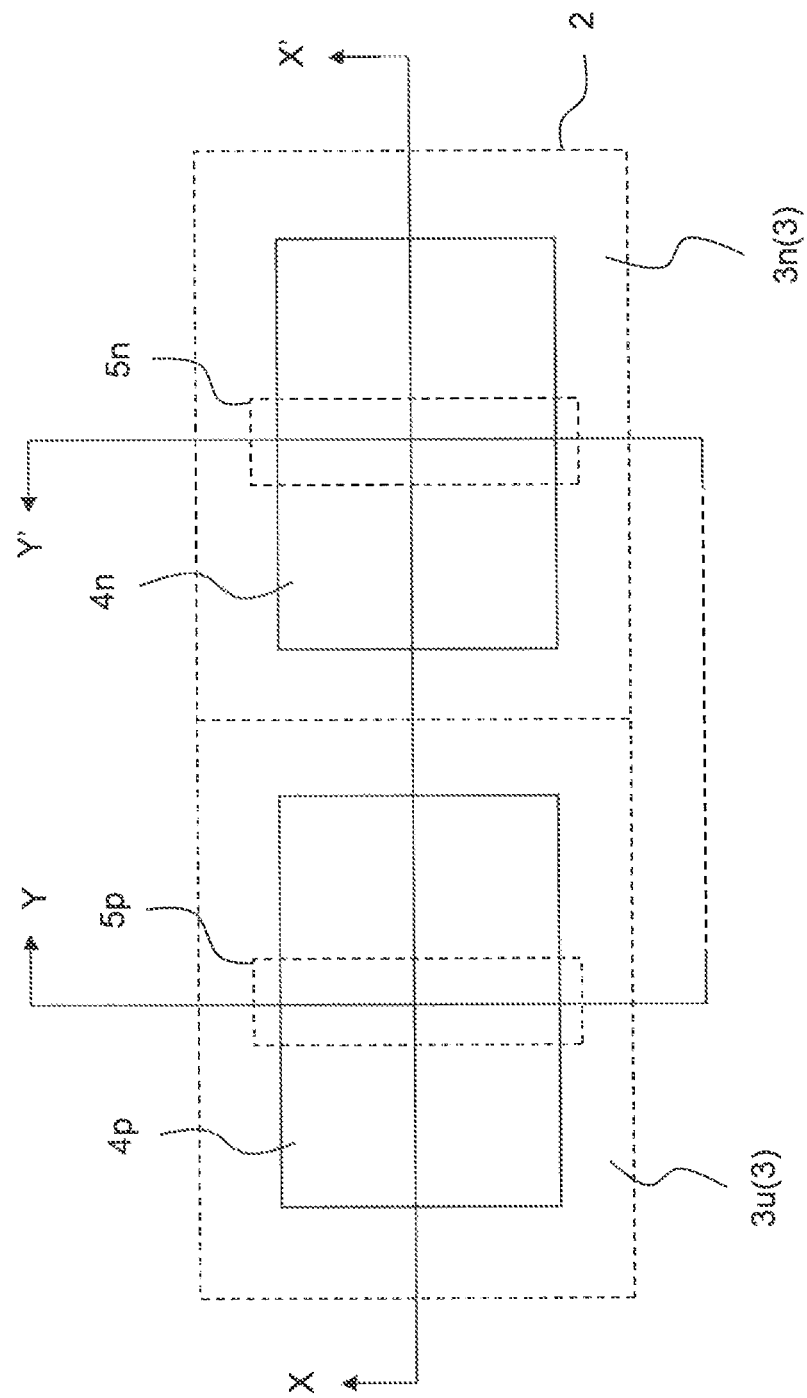
FIG. 27 is a device fragmentary top view (corresponding to FIG. 1) for describing a modification example (nitrogen doped STI structure) of the device structure of the semiconductor integrated circuit device according to the one embodiment of the present application.
Figure 28:
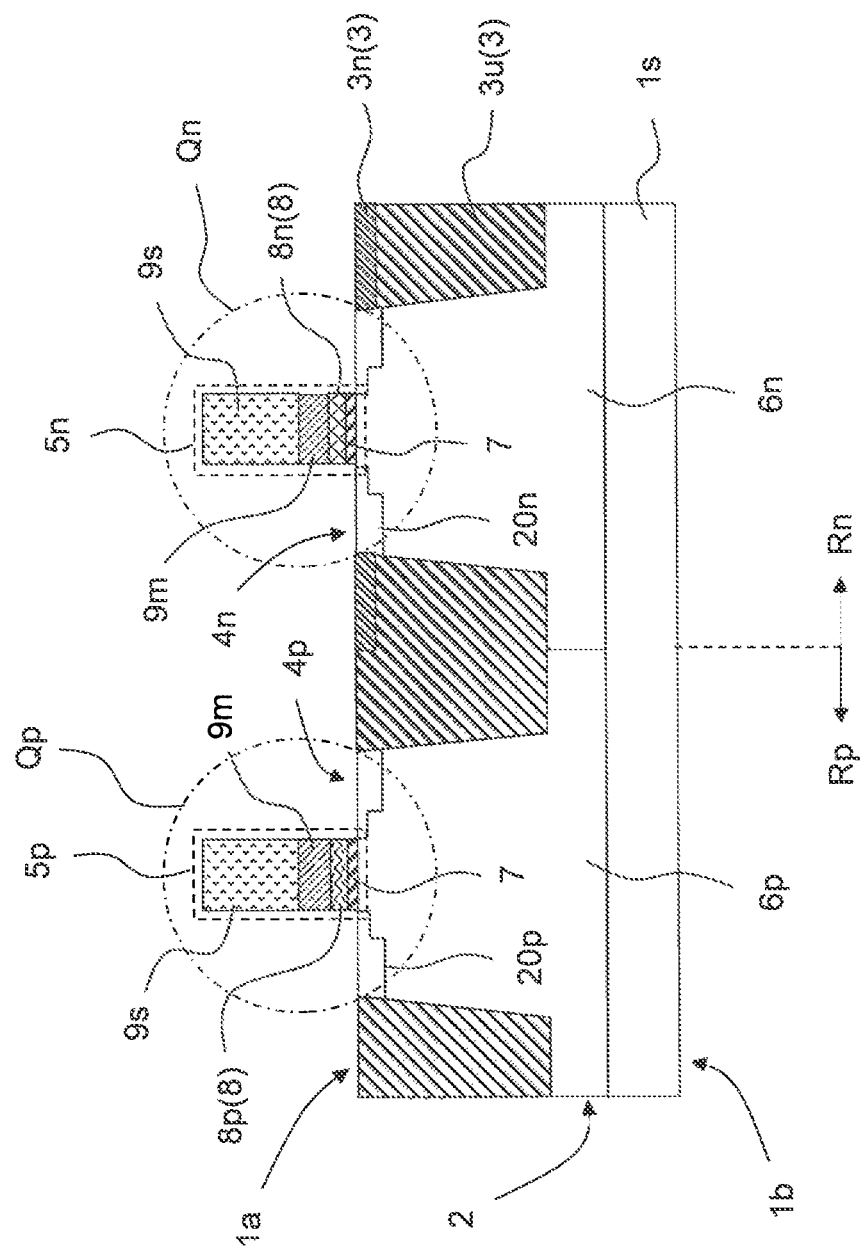
FIG. 28 is a device cross-sectional view corresponding to the X-X' cross-section of FIG. 27.
Figure 29:
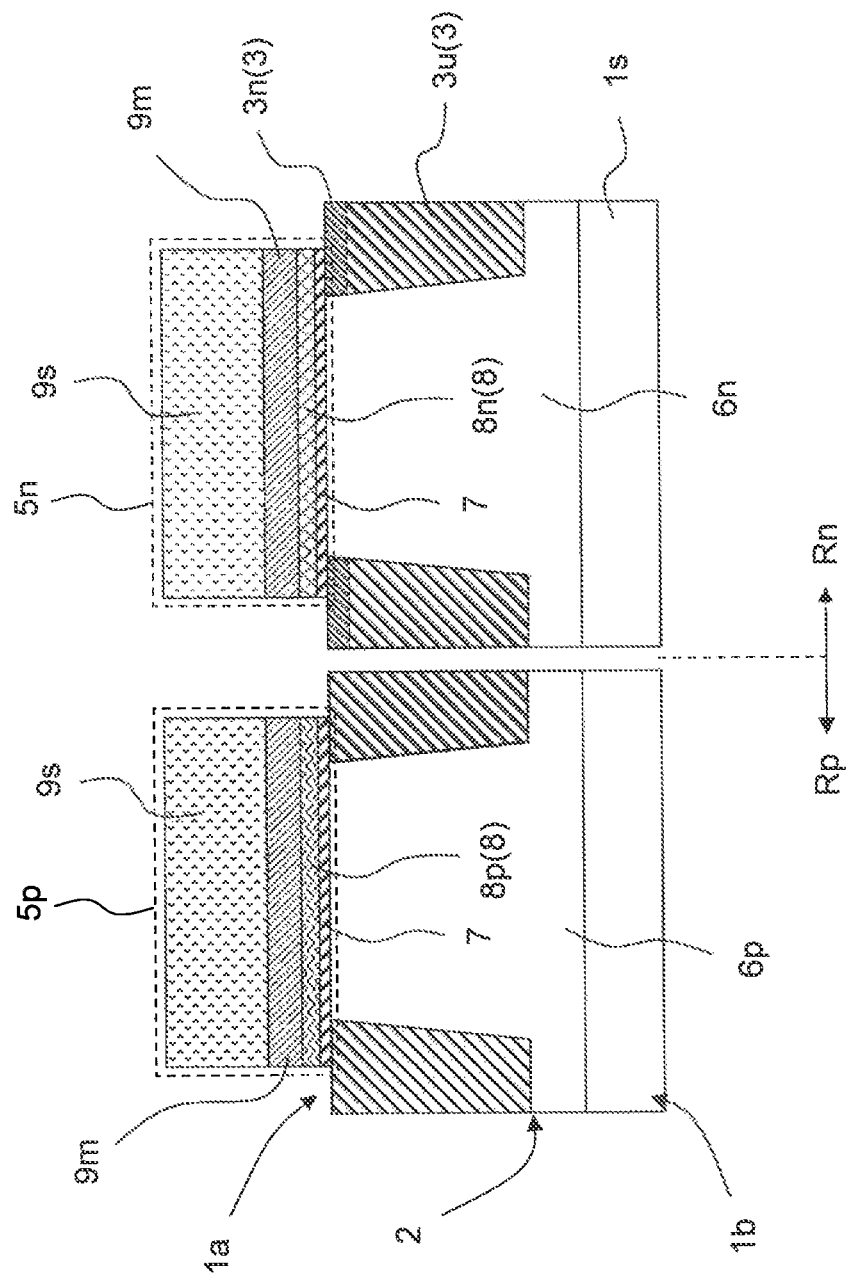
FIG. 29 is a device cross-sectional view corresponding to the Y-Y' cross-section of FIG. 27.

FIG. 27 is a device fragmentary top view (corresponding to FIG. 1) for describing a modification example (a nitrogen doped STI structure) of the device structure of the semiconductor integrated circuit device according to the one embodiment of the present application. FIG. 28 is a device cross-sectional view corresponding to the X-X' cross-section of FIG. 27, FIG. 29 is a device cross-sectional view corresponding to the Y-Y' cross-section of FIG. 27. Referring to these drawings, the modification example (nitrogen doped STI structure) of the device structure of the semiconductor integrated circuit device according to the one embodiment of the present invention will be described.

As shown in FIG. 27, on the device surface 1a of a semiconductor chip 2, respective active regions of an N channel MISFET (Qn) and a P channel MISFET (Qp) configuring a CMIS, that is, an N channel active region 4n and a P channel active region 4p are surrounded with an STI (Shallow Trench Isolation) region 3 (element isolation region). The surface region of this element isolation region 3 is divided into a nitrogen introduced region 3n (an N channel threshold voltage adjusting element outward diffusion preventing region) at the periphery of the N channel active region 4n and an N channel threshold voltage adjusting element non-introduced region 3u at the periphery of the P channel active region 4p. An N channel gate stack 5n and a P channel gate stack 5p longitudinally traverse or traverse the center portion of the N channel active region 4n and the P channel active region 4p, respectively.

Next, as shown in FIG. 28, the semiconductor chip 2 has a substrate portion 1s (a P type single crystal silicon substrate portion) and a well portion thereon. The well portion has an N well region 6n corresponding to an N channel device region Rn and a P well region 6p corresponding to a P channel device region Rp. The N channel gate stack 5n and the P channel gate stack 5p have, in the surface region thereof, an N type source drain region 20n and a P type source drain region 20p, respectively. The N channel gate stack 5n is comprised of, in order from bottom to top, an IL (Interfacial Layer), that is, an interfacial silicon oxide-based insulating film 7, an N channel High-k gate insulating film 8n (High-k gate insulating film 8), a metal gate electrode film 9m, a polysilicon gate electrode film 9s, and the like. On the other hand, the P channel gate stack 5p is comprised of, in order from bottom to top, an IL, that is, an interfacial silicon oxide-based insulating film 7, a P channel High-k gate insulating film 8p (High-k gate insulating film 8), a metal gate electrode film 9m, a polysilicon gate electrode film 9s, and the like.

Next, as shown in FIG. 29, the N channel gate stack 5n has, in the surface of the STI region 3 (element isolation region) below or at the periphery of the gate stack, the nitrogen introduced region 3n. On the other hand, the P channel gate stack 5p does not have, in the surface of the STI region 3 (element isolation region) below or at the periphery of the gate stack, the nitrogen introduced region 3n, because there is a possibility of it having an adverse effect on the threshold voltage control of the P channel MISFET (Qp).

As shown in FIG. 27, the nitrogen introduced region 3n is usually formed in almost the whole surface region of the STI region 3 (element isolation region) corresponding to the N channel device region Rn because of manufacturing ease, but it may be formed only in the surface region of the STI region 3 (element isolation region) below or at the periphery of the N channel gate stack 5n.

Thus, using, as the N channel threshold voltage adjusting element outward diffusion preventing region, the nitrogen introduced region 3n has the advantage that compared with the N channel threshold voltage adjusting element-introduced region 3d, it has less influence on the etching characteristics of the STI and also has less influence on the P channel device region Rp. On the other hand, it easily disappears by the heat treatment or the like so that the N channel threshold voltage adjusting element-introduced region 3d is more effective.

7. Description on the main part process in the method for manufacturing a semiconductor integrated circuit device corresponding to the modification example of the device structure of the semiconductor integrated circuit device according to the one embodiment of the present application (mainly FIG. 30 and FIG. 31)

In this section, one example of a manufacturing method for actualizing the device structure described in Section 6 will be described.

Figure 30:
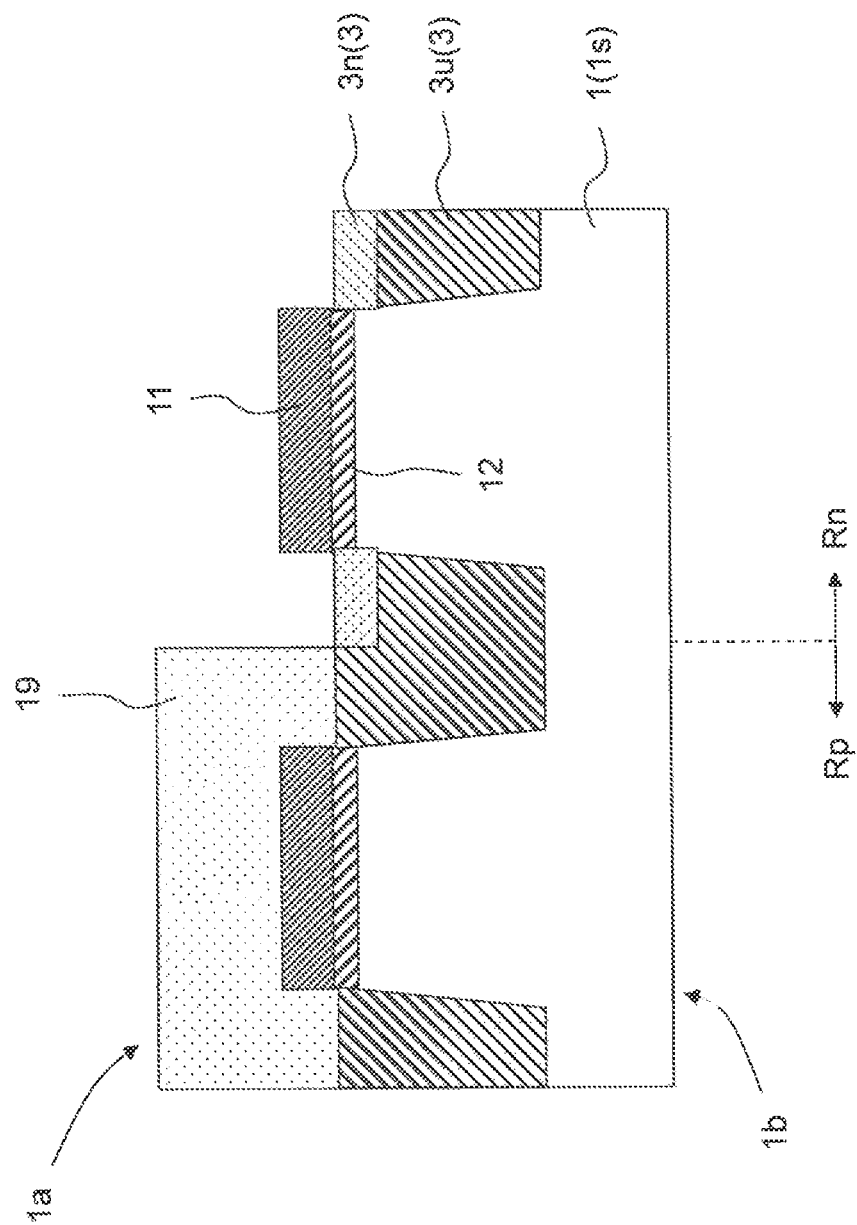
FIG. 30 is a device cross-sectional view (a step of implanting nitrogen ions) corresponding to the X-X' cross-section of FIG. 27 for describing the main part process in a manufacturing method (a nitrogen ion implantation system) corresponding to the modification example (the nitrogen doped STI structure) of the device structure of the semiconductor integrated circuit device according to the one embodiment of the present application.

FIG. 30 is a device cross-sectional view (a step of implanting nitrogen ions) corresponding to the X-X' cross-section of FIG. 27 for describing the main part process in the manufacturing method (a nitrogen ion implantation system) corresponding to the modification example (the nitrogen doped STI structure) of the device structure of the semiconductor integrated circuit device according to the one embodiment of the present application. FIG. 31 is a device cross-sectional view (a step of removing the STI forming silicon nitride film and the like) corresponding to the X-X' cross-section of FIG. 27 for describing the main part process in the manufacturing method (the nitrogen ion implantation system) corresponding to the modification example (the nitrogen doped STI structure) of the device structure of the semiconductor integrated circuit device according to the one embodiment of the present application. Referring to these drawings, the main part process in the method for manufacturing a semiconductor integrated circuit device corresponding to the modification example of the device structure of the semiconductor integrated circuit device according to the one embodiment of the present application will be described.

After the state shown in FIG. 4, a nitrogen introducing resist film 19 (having a thickness of, for example, about 300 nm) is patterned using conventional lithography (for example, ArF lithography) as shown in FIG. 30. With the thus-patterned nitrogen introducing resist film 19 as an ion implantation mask, nitrogen ions are implanted into the surface of the STI region 3 of the N channel device region Rn to form a nitrogen introduced region 3n (N channel threshold voltage adjusting element outward diffusion preventing region). Preferable ion implantation conditions are, for example, as follows: ion species: nitrogen, implantation energy: about 15 KeV, dosage: $5 \times 10^{14}/cm^2$, and the like (for example, a range of the implantation energy is from about 5 to 30 KeV and a range of dosage is from $5 \times 10^{13}/cm^2$ to $5 \times 10^{15}/cm^2$). Thus, nitrogen ions are implanted while the STI forming silicon nitride film 11 and the pad silicon oxide film 12 are present so that this method has the advantage that undesired introduction of nitrogen or the like into the N channel active region 4n can be prevented.

Then, the nitrogen introducing resist film 19 which becomes unnecessary is removed, for example, by ashing. Then, the STI forming silicon nitride film 11 is removed, for example, by using hot phosphoric acid and the device surface 1*a* of the wafer 1 is etched back with a hydrofluoric acid etching solution to remove the pad silicon oxide film 12 and the like to obtain the structure as shown in FIG. 31.

8. Summary

The invention made by the present inventors has been described specifically based on embodiments. It should however be borne in mind that the invention is not limited to or by them. It is needless to say that various modifications and changes are possible without departing from the scope of the invention.

For example, in the above-mentioned embodiment, a specific description has been made mainly with a gate first (Gate First) system as an example. It is needless to say that the present invention is not limited to it but can also be applied to a gate last (Gate Last) system.

INDUSTRIAL APPLICABILITY

The present invention can be applied widely to a threshold voltage control technology in a semiconductor integrated circuit device or a manufacturing method of a semiconductor integrated circuit device (or a semiconductor device).

EXPLANATION OF REFERENCE NUMERALS 1 semiconductor wafer
1*a* main surface (device surface) on surface side (of wafer or chip)
1*b* main surface on back side (of wafer or chip)
1*s* substrate portion (P type single crystal silicon substrate portion) (of wafer or chip)
2 semiconductor chip
3 STI region (element isolation region)
3*d* N channel threshold voltage adjusting element-introduced region (N channel threshold voltage adjusting element outward diffusion preventing region)
3*n* nitrogen introduced region (N channel threshold voltage adjusting element outward diffusion preventing region)
3*u* N channel threshold voltage adjusting element non-introduced region
4*n* N channel active region
4*p* P channel active region
5*n* N channel gate stack
5*p* P channel gate stack
6*n* N well region
6*p* P well region
7 IL (interfacial silicon oxide-based insulating film)
8 High-k gate insulating film (hafnium oxide-based High-k gate insulating film)
8*n* N channel High-k gate insulating film (lanthanum-added hafnium oxide-based High-k gate insulating film)
8*p* P channel High-k gate insulating film (aluminum-added hafnium oxide-based High-k gate insulating film)
9*m* metal gate electrode film (TiN film)
9*s* polysilicon gate electrode film
10*n* N channel threshold voltage adjusting film (lanthanum oxide film)
10*p* P channel threshold voltage adjusting film (alumina film)
11 STI forming silicon nitride film
12 pad silicon oxide film
14 N channel threshold voltage adjusting element introducing resist film
15 P channel threshold voltage adjusting film processing hardmask film (TiN film)
16 resist film for P channel threshold voltage adjusting film processing hardmask
17 N channel threshold voltage adjusting element-containing film (lanthanum oxide film)
17*s* N channel threshold voltage adjusting element-containing film sidewall
18 N channel threshold voltage adjusting element-containing film processing resist film
19 nitrogen introducing resist film
20*n* N type source drain region
20*p* P type source drain region
25 P channel device region covering hardmask film (TiN film)
26 P channel device region covering hardmask processing resist film
Qn N channel MISFET
Qp P channel MISFET
Rn N channel device region
Rp P channel device region

What is claimed is:

1. A method for manufacturing a semiconductor integrated circuit device, comprising the steps of:
    (a) forming an element isolation region in the surface of a first main surface of a semiconductor wafer to define an N channel active region and an adjacent P channel active region in the surface of the first main surface of the semiconductor substrate;
    (b) forming, over the first main surface of the semiconductor substrate, an N channel gate stack that traverses the N channel active region and constitutes an N channel MISFET;
    (c) forming, over the first main surface of the semiconductor substrate, a P channel gate stack that traverses the P channel active region and constitutes a P channel MISFET; and
    (d) prior to the steps (b) and (c) but after the step (a), forming an N channel threshold voltage adjusting element outward diffusion preventing region in the surface region of the element isolation region below and at the periphery of the N channel gate stack,
    wherein the N channel threshold voltage adjusting element outward diffusion preventing region is formed by implanting N channel threshold voltage adjusting element ions into the surface region of the element isolation region,
    wherein the N channel threshold voltage adjusting element outward diffusion preventing region is formed without forming the N channel threshold voltage adjusting element outward diffusion preventing region in the surface region of the element isolation region below and at the periphery of the P channel gate stack,
    wherein the N channel threshold voltage adjusting element is any of La, Y, Mg, or Sc,
    and wherein step (d) is performed without introducing the N channel threshold voltage adjusting element into the N channel active region.

2. A method for manufacturing a semiconductor integrated circuit device, comprising the steps of:
    (a) forming an element isolation region in the surface of a first main surface of a semiconductor wafer to define an N channel active region and an adjacent P channel active region in the surface of the first main surface of the semiconductor substrate;

(b) forming, over the first main surface of the semiconductor substrate, an N channel gate stack that traverses the N channel active region and constitutes an N channel MISFET;
(c) forming, over the first main surface of the semiconductor substrate, a P channel gate stack that traverses the P channel active region and constitutes a P channel MISFET; and
(d) prior to the steps (b) and (c) but after the step (a), forming an N channel threshold voltage adjusting element outward diffusion preventing region in the surface region of the element isolation region below and at the periphery of the N channel gate stack,
wherein the N channel threshold voltage adjusting element outward diffusion preventing region is formed by depositing an N channel threshold voltage adjusting element or oxide thereof over a portion of the surface of the element isolation region which is to be the N channel threshold voltage adjusting element outward diffusion preventing region, and heat treating a resulting film,
wherein the N channel threshold voltage adjusting element outward diffusion preventing region is formed without forming the N channel threshold voltage adjusting element outward diffusion preventing region in the surface region of the element isolation region below and at the periphery of the P channel gate stack,
wherein the N channel threshold voltage adjusting element or oxide thereof is any of La, Y, Mg, Sc, or oxides thereof,
and wherein step (d) is performed without introducing the N channel threshold voltage adjusting element into the N channel active region.

* * * * *